US010375362B2

(12) United States Patent
Shishido

(10) Patent No.: US 10,375,362 B2
(45) Date of Patent: Aug. 6, 2019

(54) IMAGING DEVICE AND CAMERA SYSTEM

(71) Applicant: Panasonic Intellectual Property Management Co., Ltd., Osaka (JP)

(72) Inventor: Sanshiro Shishido, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/876,262

(22) Filed: Jan. 22, 2018

(65) Prior Publication Data

US 2018/0227551 A1    Aug. 9, 2018

(30) Foreign Application Priority Data

Feb. 3, 2017   (JP) .................................. 2017-019034

(51) Int. Cl.
| | | |
|---|---|---|
| *H04N 5/335* | (2011.01) | |
| *H04N 9/04* | (2006.01) | |
| *H01L 27/30* | (2006.01) | |
| *H04N 5/347* | (2011.01) | |

(Continued)

(52) U.S. Cl.
CPC ........... *H04N 9/045* (2013.01); *H01L 27/307* (2013.01); *H04N 5/335* (2013.01); *H04N 5/347* (2013.01); *H04N 5/374* (2013.01); *H04N 5/378* (2013.01); *H04N 2209/042* (2013.01)

(58) Field of Classification Search
CPC ...................................................... H04N 5/347
See application file for complete search history.

(56) References Cited

U.S. PATENT DOCUMENTS

| | | | |
|---|---|---|---|
| 9,941,316 B2 * | 4/2018 | Sargent | H04N 5/378 |
| 2007/0013798 A1 | 1/2007 | Ahn et al. | |
| 2007/0076093 A1 | 4/2007 | Misawa | |

(Continued)

FOREIGN PATENT DOCUMENTS

| | | |
|---|---|---|
| JP | 2007-104113 | 4/2007 |
| JP | 2010-136225 | 6/2010 |

(Continued)

OTHER PUBLICATIONS

Takayuki Okatani, "Deep learning and image recognition—Fundamentals and Recent Trends—", Operations Research, Apr. 2015, pp. 198-204, InternetURL:http://www.orsj.or.jp/archive2/or60-4/or60_4_198.pdf.

*Primary Examiner* — Gary C Vieaux
(74) *Attorney, Agent, or Firm* — McDermott Will & Emery LLP

(57) ABSTRACT

An imaging device includes: a pixel array including first and second pixels, each pixel including a photoelectric converter converting light into charge and a detection circuit detecting the charge; a first voltage supply circuit supplying a first voltage to the first pixel such that an electric potential of the first electrode is set to a first electric potential at a point of time at which a charge accumulation period for the first pixel starts; a second voltage supply circuit supplying a second voltage to the second pixel such that an electric potential of the first electrode of the second pixel is set to a second electric potential different from the first electric potential at a point of time at which a charge accumulation period for the second pixel starts; and an addition circuit adding together signals generated in the first and second pixels.

12 Claims, 26 Drawing Sheets

(51) Int. Cl.
*H04N 5/374* (2011.01)
*H04N 5/378* (2011.01)

(56) References Cited

U.S. PATENT DOCUMENTS

2015/0189249 A1 7/2015 Hiyama et al.
2015/0350574 A1 12/2015 Okado

FOREIGN PATENT DOCUMENTS

| JP | 2013-070180 | 4/2013 |
| JP | 2015-128215 | 7/2015 |
| JP | 2015-226161 | 12/2015 |
| JP | 2016-009872 | 1/2016 |

\* cited by examiner

IMAGING DEVICE AND CAMERA SYSTEM

BACKGROUND

1. Technical Field

The present disclosure relates to an imaging device and a camera system including the imaging device.

2. Description of the Related Art

Image sensors utilizing photoelectric conversion are widely known. For example, a CMOS (Complementary Metal Oxide Semiconductor) image sensor including a photodiode is widely used. The CMOS image sensor has a feature that it operates with low power consumption and it is possible to access an individual pixel. In the present specification, the pixel is also referred to as a unit pixel cell. In the CMOS image sensor, a rolling shutter is generally used as a signal reading method. In the rolling shutter, exposure and signal charge reading are sequentially performed on pixels of a pixel array on a row-by-row basis. Note that the pixel array is a collection of pixels arranged in a two-dimensional array form. In a rolling shutter operation, starting and ending are different from one row to another of the pixel array. This may cause distortion to occur in an image captured for an object moving at a high speed, or may cause an unevenness of brightness to occur in an image when a flash is used. To handle the above-described situation, it is needed to employ a so-called global shutter function in which starting and ending of exposure are common for all pixels in the pixel array.

For example, U.S. Patent Application Publication No. 2007/0013798 discloses a CMOS image sensor having a global shutter capability. In the technique disclosed in U.S. Patent Application Publication No. 2007/0013798, a transfer transistor and a charge accumulation unit (for example, a capacitor or a diode) are provided in each of a plurality of pixels. In each pixel, the charge accumulation unit is connected to a photodiode via the transfer transistor.

In recent years, in an image recognition field, much attention has been paid to deep learning. In the deep learning, a convolutional neural network is used. Furthermore, in the deep learning, as described in "Deep learning and image recognition", Operations Research, pp 198-204, Web site URL: http://www.orsj.o.jp/archive2/or60-4/or60_4_198.pdf, many processes are performed on acquired image data to improve the recognition rate.

One of techniques to increase the speed of reading data from each pixel is, as described in Japanese Unexamined Patent Application Publication No. 2016-9872, to add together signals output from a plurality of pixels. However, in the technique disclosed in Japanese Unexamined Patent Application Publication No. 2016-9872, it is not capable of adding products (that is, operation of determining a sum of products) depending on filter characteristics.

SUMMARY

One non-limiting and exemplary embodiment provides a technique to reduce a digital processing load in image processing using a filter or the like in image recognition or deep learning.

In one general aspect, the techniques disclosed here feature an imaging device comprising: a pixel array including a plurality of pixels including a first pixel and a second pixel, each pixel including a photoelectric converter that converts light into charge and a detection circuit that detects the charge, the photoelectric converter including a first electrode, a second electrode facing the first electrode, and a photoelectric conversion layer between the first electrode and the second electrode; a first voltage supply circuit that supplies a first voltage to the first pixel such that an electric potential of the first electrode is set to a first electric potential at a point of time at which a charge accumulation period for the first pixel starts; a second voltage supply circuit that supplies a second voltage to the second pixel such that an electric potential of the first electrode of the second pixel is set to a second electric potential different from the first electric potential at a point of time at which a charge accumulation period for the second pixel starts; and an addition circuit that adds together a signal generated in the first pixel and a signal generated in the second pixel.

It should be noted that general or specific embodiments may be implemented as an element, a device, an apparatus, a camera system, an integrated circuit, a method, a computer program, or a computer-readable storage medium in which a program is stored. It should be noted that general or specific embodiments may be implemented by any selective combination of as an element, a device, an apparatus, a camera system, an integrated circuit, a method, a computer program, or a computer-readable storage medium in which a program is stored.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
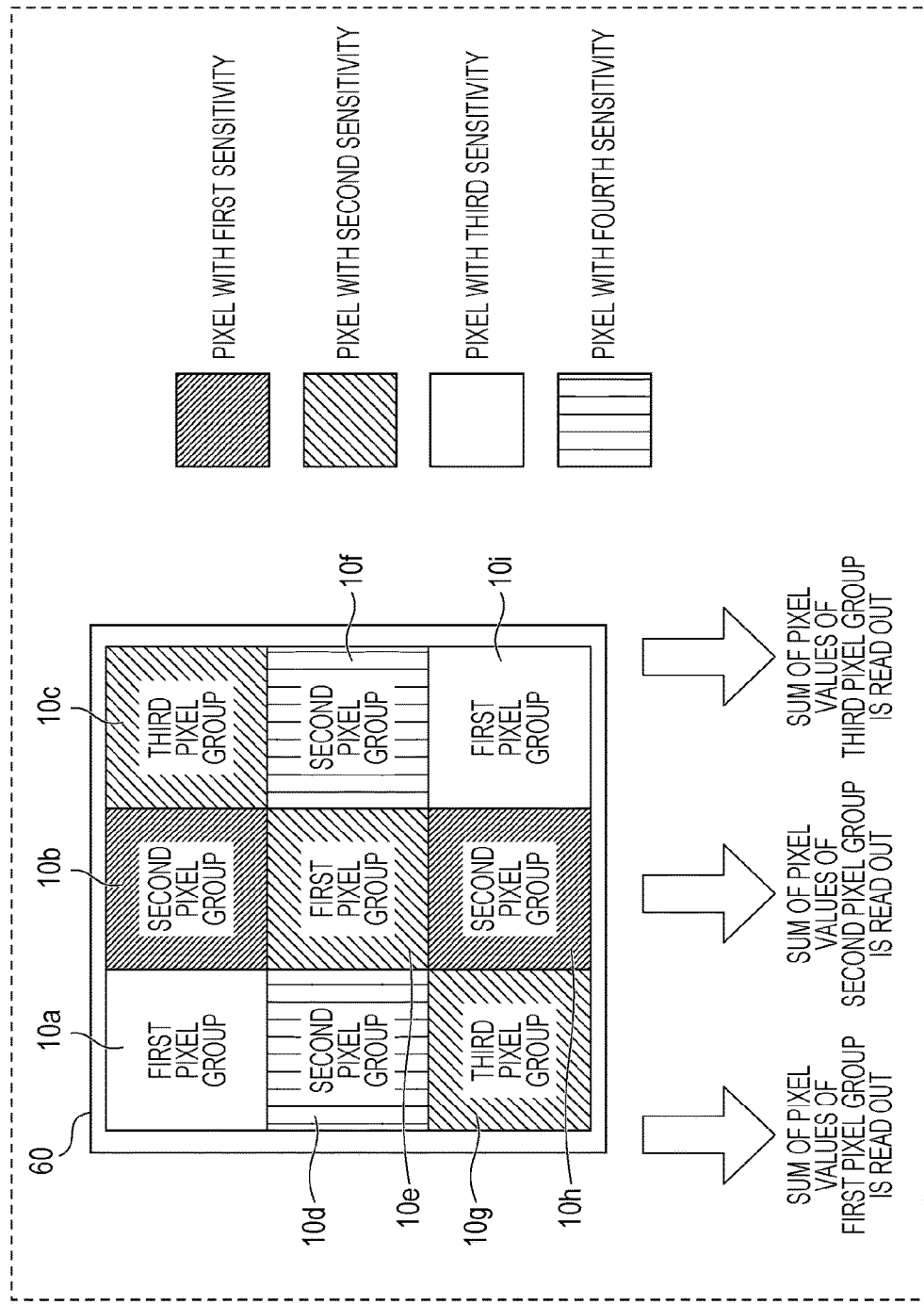
FIG. 1 is a schematic diagram illustrating an example of a circuit configuration of an imaging device according to an embodiment of the present disclosure.

The present disclosure includes an imaging device and an image capturing module described below.

In an aspect of the present disclosure, an imaging device includes: a pixel array including a plurality of pixels including a first pixel and a second pixel, each pixel including a photoelectric converter that converts light into charge and a detection circuit that detects the charge, the photoelectric converter including a first electrode, a second electrode facing the first electrode, and a photoelectric conversion layer between the first electrode and the second electrode; a first voltage supply circuit that supplies a first voltage to the first pixel such that an electric potential of the first electrode is set to a first electric potential at a point of time at which a charge accumulation period for the first pixel starts; a second voltage supply circuit that supplies a second voltage to the second pixel such that an electric potential of the first electrode of the second pixel is set to a second electric potential different from the first electric potential at a point of time at which a charge accumulation period for the second pixel starts; and an addition circuit that adds together a signal generated in the first pixel and a signal generated in the second pixel.

In the imaging device described above, the addition is performed on the pixel array including the plurality of pixels having different sensitivities such that at least signals output from two pixels are added together. Executing the addition of pixels having different sensitivities provides a result equivalent to a result obtained when a sum-of-products operation is performed in the imaging device, and thus a reduction is achieved in digital processing load in the image processing.

In the imaging device described above, the addition circuit may include a vertical signal line that is connected to both the first pixel and the second pixel, and the addition circuit adds together a signal output from the first pixel and a signal output from the second pixel.

In this configuration, a plurality of pixels disposed in the same column simultaneously output signals to the same vertical signal line, which results in acquiring the sum of pixel values. Thus, the sum of pixel values is acquired via a simple addition circuit provided in the imaging device, which results in a reduction in digital processing load in the image processing.

In the imaging device described above, each of the plurality of pixels may include a charge accumulation element that accumulates the charge generated in the photoelectric converter, and the addition circuit includes an interconnection line that connects the charge accumulation element of the first pixel to the charge accumulation element of the second pixel.

In this configuration, the pixel addition operation is achieved by connecting together charge accumulation elements of a plurality of pixels of interest to be subjected to the pixel addition operation. Thus, the sum of pixel values is acquired via a simple addition circuit provided in the imaging device, and thus a reduction is achieved in digital processing load in the image processing.

In the imaging device described above, the addition circuit may include a first vertical signal line that is connected to the first pixel and that transmits a signal output from the first pixel, a second vertical signal line that is connected to the second pixel and that transmits a signal output from the second pixel, and an interconnection line that connects the first vertical signal line to the second vertical signal line.

In this configuration, even for a plurality of pixels located in different columns, the pixel addition operation is performed via vertical signal lines connected to the pixels and via interconnection lines connecting the vertical signal lines. Thus, the sum of pixel values is acquired via a simple addition circuit provided in the imaging device, and thus a reduction is achieved in digital processing load in the image processing.

In the imaging device described above, an electric potential difference between the first electrode and the second electrode of the first pixel at the point of time at which the charge accumulation period for the first pixel starts may be different from an electric potential difference between the first electrode and the second electrode of the second pixel at the point of time at which the charge accumulation period for the second pixel starts.

By forming each of the plurality of pixels such that the pixel includes a photoelectric conversion layer formed of an organic material or the like having a sensitivity that changes depending on a voltage applied between the first electrode and the second electrode, it becomes possible to set the sensitivity individually for each pixel and thus it becomes possible to perform a sum-of-products operation with arbitrary operation coefficients.

In the imaging device described above, the pixel array may include a first pixel block that includes a first pixel group including the first pixel and a second pixel group including the second pixel, pixels belonging to the first pixel group being different from pixels belonging to the second pixel group, and the addition circuit adds together signals respectively output from the pixels belonging to the first pixel group and adds together signals respectively output from the pixels belonging to the second pixel group.

The pixel addition operation is performed, in the imaging device, for a pixel group making up a pixel block including pixels having different sensitivities. This results in a reduction in digital processing load in the image processing.

The imaging device described above may further include a subtraction circuit that subtracts the sum of the signals respectively output from the pixels belonging to the second pixel group from the sum of the signals respectively output from the pixels belonging to the first pixel group.

The operation of subtracting the sum of signals of the second pixel group from the sum of signals of the first pixel group is performed in the imaging device, and thus it is possible to achieve a reduction in digital processing load in the image processing such as a filtering process for unsharp masking.

In the imaging device described above, the pixels belonging to the first pixel group may be arranged in a first pattern and the pixels belonging to the second pixel group are arranged in a second pattern, the pixel array includes a second pixel block different from the first pixel block, the second pixel block including a third pixel group including pixels arranged in the first pattern and a fourth pixel group including pixels arranged in the second pattern, and the addition circuit adds together signals respectively output from the pixels belonging to the third pixel group and adds together signals respectively output from the pixels belonging to the fourth pixel group.

Thus, the filtering process on the plurality of pixels in the pixel array is performed in the imaging device, which results in a reduction in the digital processing load in the filtering process for the unsharp masking. In the imaging device described above, the detection circuit may include a transistor having a source and a drain, one of the source and the drain being connected to the first electrode, the first voltage supply circuit supplies the first voltage to the other one of the source and the drain of the transistor of the first pixel in a reset period for the first pixel, and the second voltage supply circuit supplies the second voltage different from the first voltage to the other one of the source and the drain of the transistor of the second pixel in a reset period for the second pixel. In the imaging device described above, the detection circuit may include a capacitor, one end of the capacitor being connected to the first electrode, the first voltage supply circuit supplies a first voltage to the other end of the capacitor in the charge accumulation period for the first pixel, and the second voltage supply circuit supplies a second voltage different from the first voltage to the other end of the capacitor in the charge accumulation period for the second pixel. In the imaging device described above, the second electrode of the first pixel and the second electrode of the second pixel may form a single continuous electrode.

In an aspect, a camera system includes the imaging device described above and a camera signal processor that processes an image signal output from the imaging device and outputs resultant image data.

The providing of the imaging device having the features described above makes it possible to realize a camera system capable of performing high-speed image processing.

Embodiments of the present disclosure are described in detail below with reference to drawings. Note that any embodiment described below is provided to illustrate a general or specific example. That is, in the following embodiments of the present disclosure, values, shapes, materials, constituent elements, locations of the constituent elements and manners of connecting the constituent elements, steps, the order of steps, and the like are described by way of example but not limitation. Note that arbitrary two or more of various aspects disclosed in the present specification may be combined together as long as no inconsistency occurs. Among constituent elements described in the following embodiments, those constituent elements that are not described in independent claims indicating highest-level concepts of the present disclosure are optional. Note that constituent elements having substantially the same functions are denoted by similar reference symbols or numerals, a duplicated description thereof may be omitted.

EMBODIMENTS

In the above-described convolutional neural network in the deep learning, image processing is performed via hierarchical processing layers including a convolutional layer and a pooling layer. In the convolutional layer, various filtering processes are applied. These processes are performed as image processing on a signal output from the image sensor. That is, these processes are performed outside the image sensor. However, the image processing includes a plurality of operations in which reading from a large number of pixels is performed and a large operation load is imposed, which results in limiting data rate, that is, a reduction in processing speed occurs. In the present disclosure, to handle the above situation, part of the convolution process is performed in an image sensor chip thereby achieving a reduction in digital processing load in the image processing.

FIG. 1 illustrates a pixel block 60 included in an imaging device (also called an image sensor) according to a first embodiment of the present disclosure. More specifically, the pixel block 60 illustrated here includes 3×3 pixels (pixels 10a to 10i) to which a convolution filter is applied. In the filter, symbol "×" denotes a multiplication operation. Note that the configuration of the pixel block 60 is not limited to this configuration including 3×3 pixels, but the configuration may be arbitrarily changed depending on the filter which is applied to the pixel block 60. In the present disclosure, a proper sensitivity is set to each pixel thereby setting a gain of the pixel. An operation of adding pixel values and outputting a result sum is performed for an arbitrary pixel group in a pixel block or for all pixels of the pixel block. In this processing scheme, charges are accumulated in pixels set to have different sensitivities, and thus the multiplication process is completed in the photoelectric conversion process. By subsequently performing a pixel addition process in a reading process or performing simultaneous reading, the addition process is completed. Thus, the addition-of-products operation is achieved. Here, the "addition" refers to adding signals output from a plurality of pixels, and is also referred to as a "pixel addition".

In the example shown in FIG. 1, nine pixels 10a to 10i are classified into three pixel groups. Each of these three pixel groups is a collection of pixels to be subjected to the addition process. The first pixel group includes three pixels 10a, 10e, and 10i arranged in a diagonal direction sloping down to the right. The second pixel group includes four pixels 10b, 10d, 10f, and 10h arranged at staggered locations. The third pixel group includes two pixels 10c and 10g arranged in a diagonal direction sloping down to the left. Furthermore, the nine pixels 10a to 10i are classified into four types by sensitivity. That is, two pixels 10b and 10h have a first sensitivity, three pixels 10c, 10e, and 10g have a second sensitivity, two pixels 10a and 10i have a third sensitivity, and two pixels 10d and 10f have a fourth sensitivity. By reading added pixel values of the pixels of the first pixel group, it is possible to obtain the sum of pixels 10a and 10i with the third sensitivity and the pixel 10e with the second sensitivity. By reading added pixel values of the pixels of the second pixel group, it is possible to obtain the sum of pixels 10b and 10h with the first sensitivity and the pixels 10d and 10f with the fourth sensitivity. By reading added pixel values of the pixels of the third pixel group, it is possible to obtain the sum of pixels 10c and 10g with the second sensitivity. Thus, the pixel values output from the nine pixels 10a to 10i are obtained such that the pixel values of the pixels are added together for each of the first to third pixel groups, and resultant sums are obtained for the respective pixel groups. Thus, the number of pieces of read-out data and the number of times the reading operation is performed are reduced to one-third of those required in the case where reading is performed for one pixel at a time.

First Variation

Figure 2:
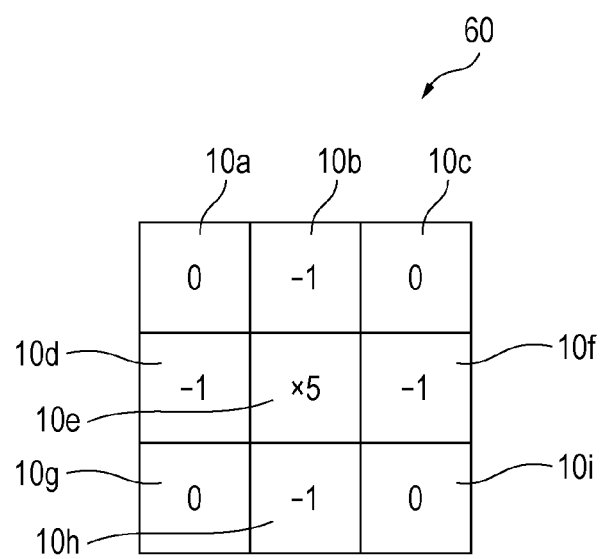
FIG. 2 is a diagram illustrating an example of a filter applied to a convolutional layer.

In the convolutional layer described above, various filtering processes are applied. FIG. 2 illustrates one example of a filter. This filter is applied to 3×3 pixels at a time, and has a filter characteristic for unsharp masking. This filter is applied, at a time, to a 3×3 sub pixel array of a pixel array including a large number of pixels arranged in a two-dimensional array form, and the filter is applied repeatedly while shifting the sub pixel array position in the pixel array. Outputs from pixels in the 3×3 sub pixel array, to which the filter is applied, are added together and a resultant one value is output. That is, the filter is applied to pixels arranged in a predetermined pattern, and this pattern is applied repeatedly to the pixel array. The pixels in the filter pattern are respectively assigned different sensitivities, and more specifically, the pixels are classified into three pixel groups according to different operation coefficients of −1, 5, and 0. Note that when operation coefficients are equal in magnitude but different in sign, they are regarded as being different from each other. In the present example, the pixels 10b, 10d, 10f, and 10h are assigned −1 as their operation coefficient. The pixel 10e is assigned 5 as its operation coefficient. The pixels 10a, 10c, 10g, and 10i are assigned 0 as their operation coefficient.

Figure 3:
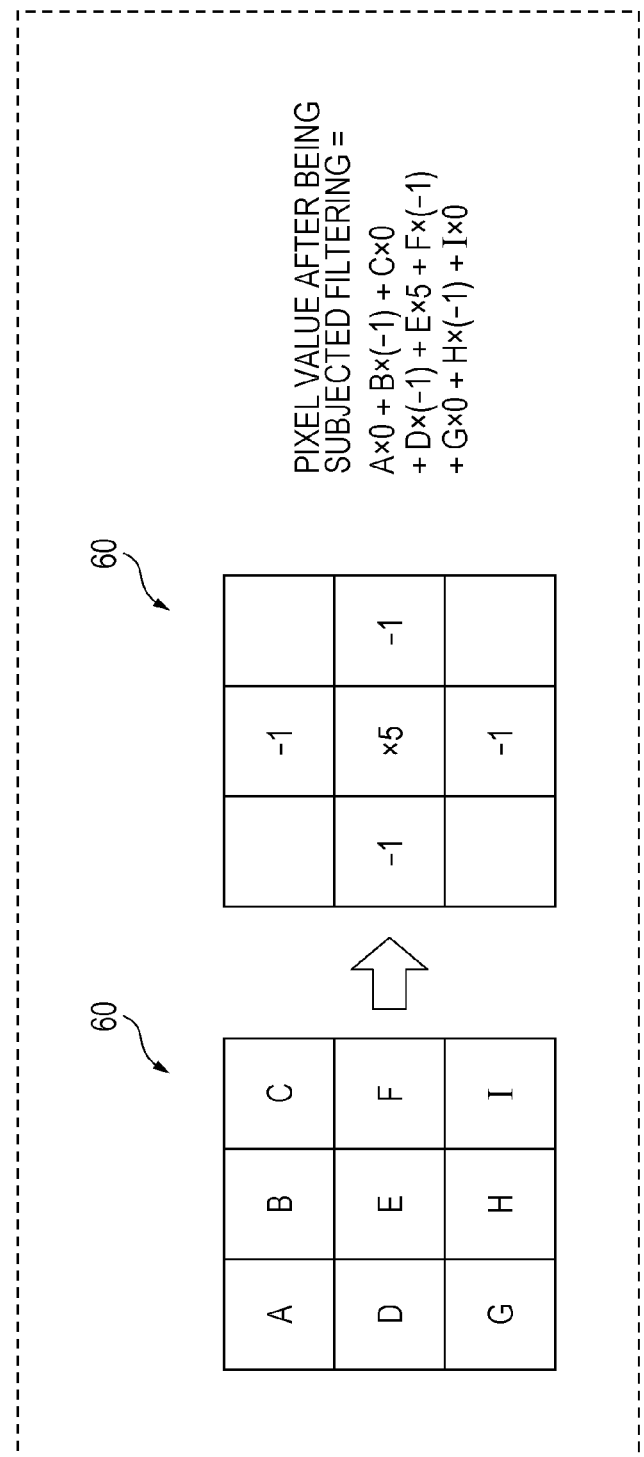
FIG. 3 is a diagram illustrating an example of an operation using a filter.

FIG. 3 illustrates an example of a filtering operation. On the left side of FIG. 3, A to I in the pixel block 60 respectively denote pixel values output from the corresponding pixels. In the center of FIG. 3, values described in the pixel block 60 denote operation coefficients. On the right side of FIG. 3, an operation expression denotes a pixel addition operation performed by the filter. For example, the filter shown in FIG. 2 causes the pixel values of the pixels 10a, 10c, 10g, and 10i respectively located in four corners to be multiplied by 0. On the other hand, the pixel value of the pixel 10e located in the center is multiplied by 5. The pixel values of the pixels 10b, 10d, 10f, and 10h located above, below, to the right of, and to the left of the center pixel 10e are each multiplied by −1. The pixel values are respectively multiplied by the corresponding operation coefficients, and resultant products are added together. The resultant sum (that is, the sum of products) is output.

In the example described above with reference to FIG. 2 and FIG. 3, sensitivities corresponding to negative operation coefficients are assigned to some pixels. However, the method of achieving the sum of products with negative operation coefficients is not limited to this example. For example, positive sensitivities may be set to all pixels, and a sum of pixel values of a second pixel group may be subtracted from a sum of pixel values of a first pixel group thereby achieving a sum-of-products operation for negative operation coefficients. In the case of the example of the filtering process shown in FIG. 2, a sensitivity corresponding to an operation coefficient of 1 may be set to each of the pixels 10b, 10d, 10f, and 10h having an operation coefficient of −1 in FIG. 2, and the sum of the pixel values of the pixels 10b, 10d, 10f, and 10h, that is, B+D+F+H, is subtracted from the pixel value E of the center pixel 10e by using a subtraction circuit. As a result, it is possible to obtain the same sum of products as that obtained according to the formula shown in FIG. 3. The subtraction circuit for such a purpose may be realized by a subtraction circuit provided in the imaging device as described later (see FIG. 25).

Figure 4:
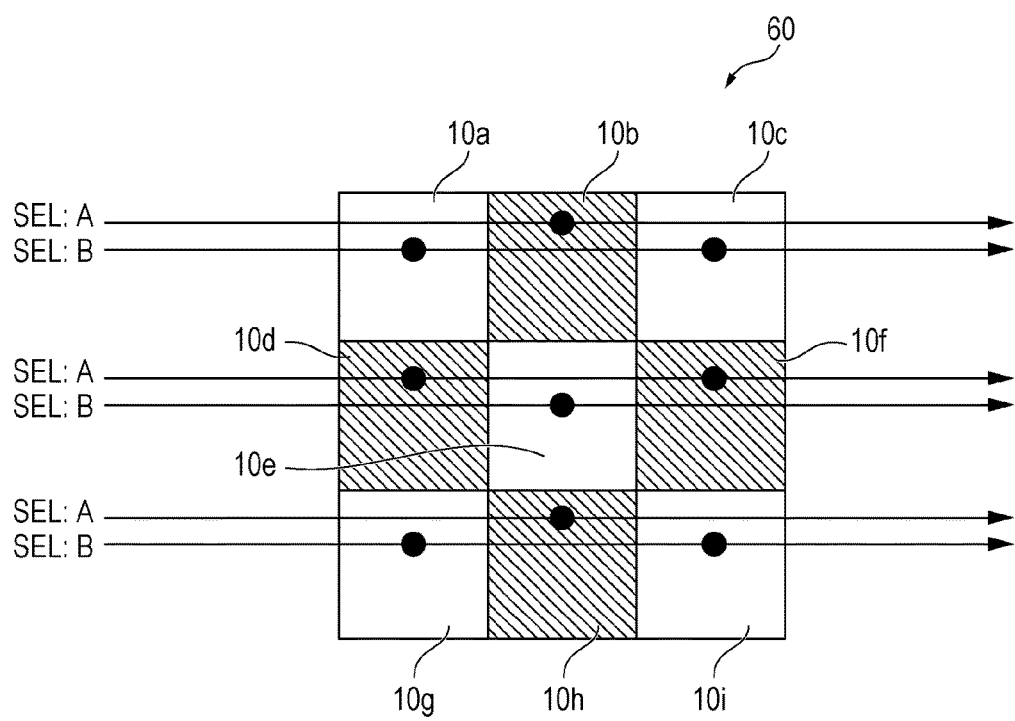
FIG. 4 is a diagram illustrating an example of a set of horizontal control lines in a situation in which a filter is used.

FIG. 4 illustrates an example of a set of horizontal control lines which may be suitably used in applying the filter shown in FIG. 2. In the case of an unsharp masking filter, as shown in FIG. 4, the hatched pixels 10b, 10d, 10f, and 10h arranged in the staggered locations have the same operation coefficients. The filter includes three pixel groups, but only two horizontal control lines (SEL: A and SEL: B) are necessary to select pixels. By turning on SEL: A for all three rows simultaneously, the hatched pixels 10b, 10d, 10f, and 10h are selected, while one or more pixels in the non-hatched pixels 10a, 10c, 10e, 10g, and 10i in a particular row are selected by turning on SEL: B in the particular row. Turning on SEL: A means that the horizontal control line SEL: A is set to a logical level that causes it to select pixels connected to the control line SEL: A.

Figure 5:
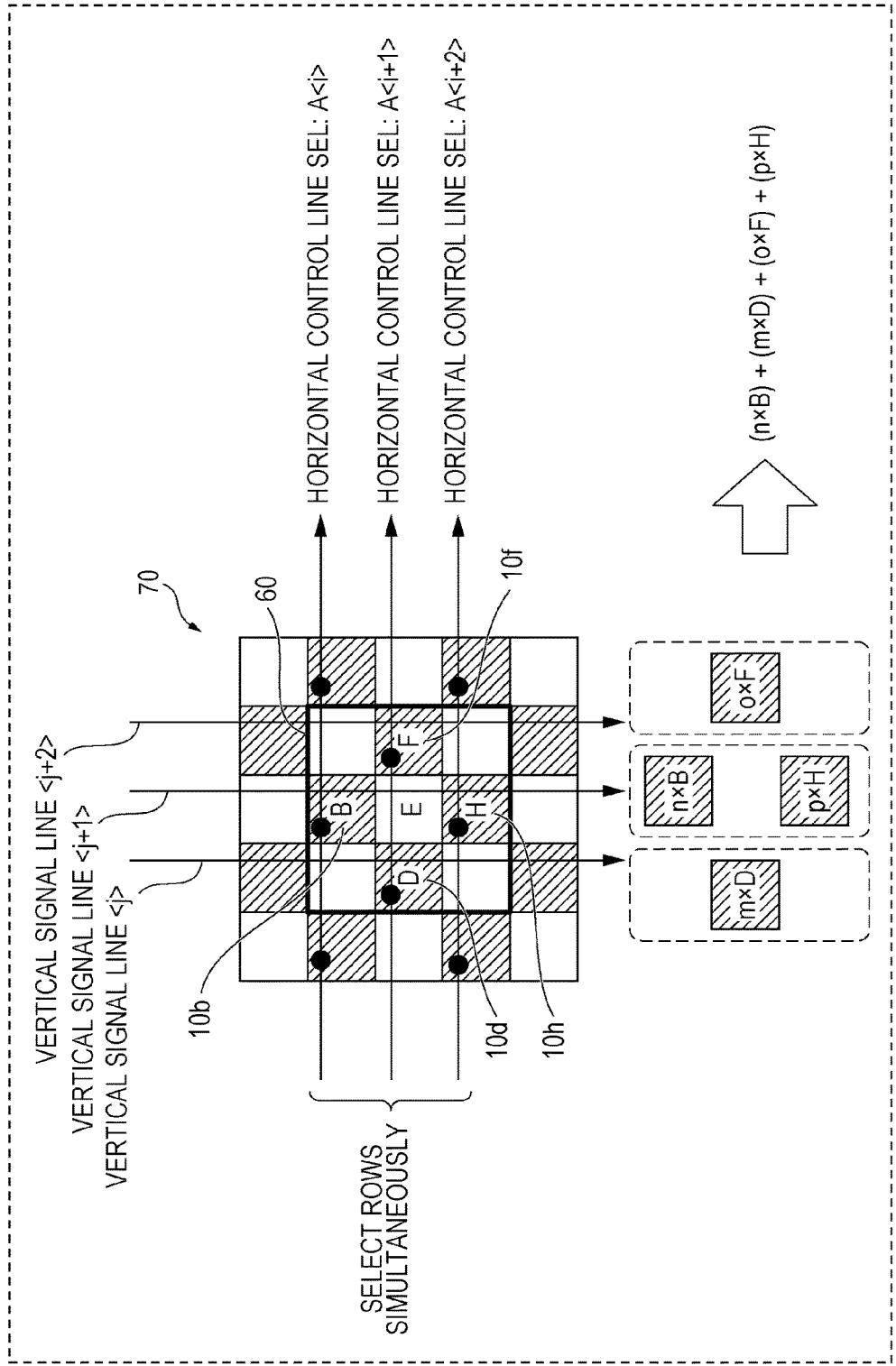
FIG. 5 is a diagram illustrating an example of a reading operation using a filter and horizontal control lines.

FIG. 5 illustrates an example of a reading operation using the filter shown in FIG. 2 and the horizontal control lines (SEL: A) shown in FIG. 4. For the 3×3 pixel block 60, three horizontal control lines SEL: A <i> to SEL: A <i+2> are simultaneously turned on, signals are read to three respective vertical signal lines <j> to <j+2>. The vertical signal lines <j> to <j+2> are each interconnection line that transmits signals output from pixels located in the same column. The pixels 10b, 10d, 10f, and 10h sense light with sensitivities respectively corresponding to relative sensitivities n, m, o, and p. The pixel 10b and the pixel 10h are read to the same vertical signal line <j+1>, and thus the sum (the sum of produces) of signals given as n×B+p×H is read to the vertical signal line <j+1>. Thereafter, signals of three columns are added together by the column circuit. As a result, the sum of pixel values of the hatched pixels 10b, 10d, 10f, and 10h in the pixel block 60 is read as n×B+m×D+o×F+p×H.

Figure 6:
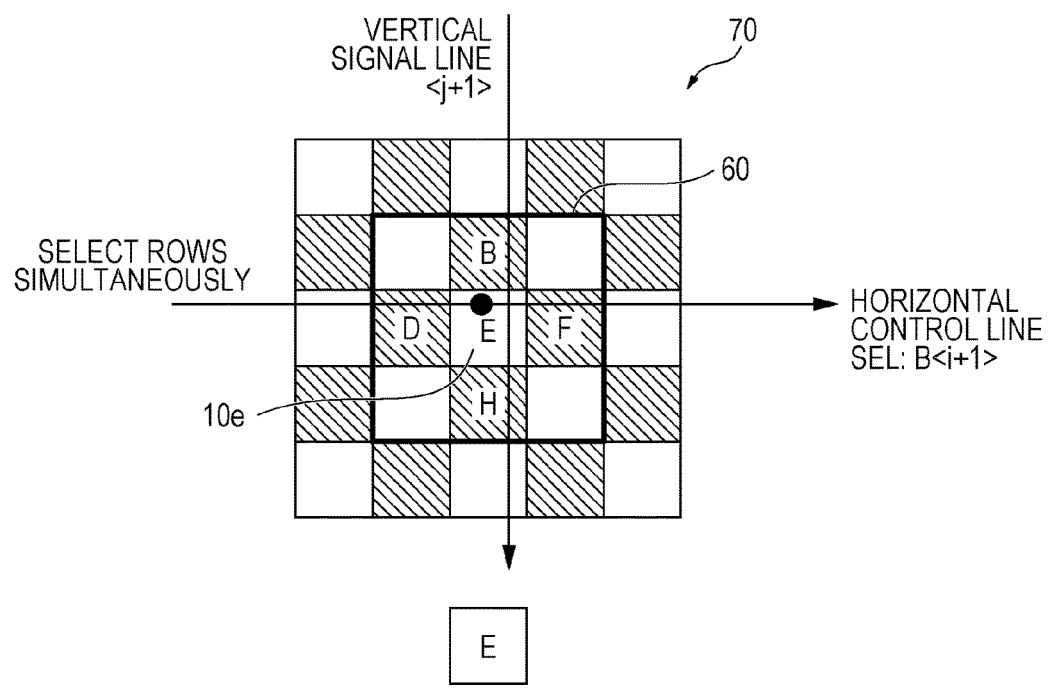
FIG. 6 is a diagram illustrating an example of a reading operation using a filter and a horizontal control line.

FIG. 6 illustrates a reading operation using the filter shown in FIG. 2 and the horizontal control line (SEL: B) shown in FIG. 4. The horizontal control line SEL: B<i+1> is turned on so as to select the pixel 10e, and a signal from the pixel 10e is read to the vertical signal line <j+1>.

Via the operations shown in FIG. 5 and FIG. 6, reading corresponding to unsharp masking is completed. Note that the operation coefficients are 0 for the pixels 10a, 10c, 10g, and 10i located in the four corners of the pixel block 60, and thus the reading is not performed in the example of the reading operation described above. However, the pixel addition reading may be performed under the condition that the sensitivities of these pixels 10a, 10c, 10g, and 10i are set to 0.

Figure 7A:
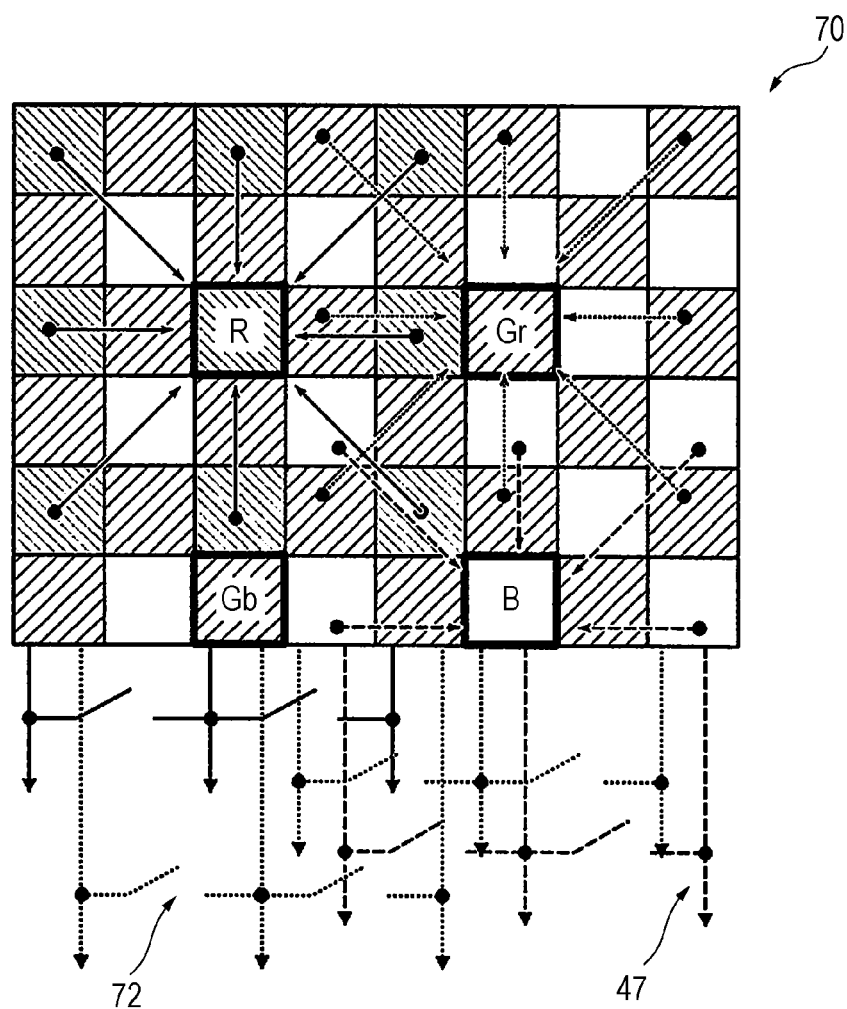
FIG. 7A illustrates an example of a pixel arrangement pattern used in a filtering process with a color filter.

FIG. 7A illustrates an example of a pixel arrangement pattern used in a filtering process with a color filter. In an image sensor with a color filter, the filter may have a 3×3 pixel array structure such as that shown in FIG. 2, and the filter may be applied to pixel groups with the same color in the pixel array 70. In the pixel array 70, pixels are arranged such that a Bayer pattern is achieved by four unit pixel cell, that is, an R pixel for acquiring red color information, a Gr pixel for acquiring green color information disposed at a location apart by two pixels rightward from the R pixel, a Gb pixel for acquiring green color information disposed at a location apart by two pixels downward from the R pixel, and a B pixel for acquiring blue color information disposed at a location apart by two pixels rightward and two pixel downward from the R pixel. In the pixel array 70, for each set of pixels having the same color, neighboring pixels are convoluted to a center pixel, for each color of four colors, as indicated by arrows in FIG. 7A such that the color barycenter is maintained unchanged. To achieve an enhanced efficiency in reading a plurality of pixels located in different columns, one or more vertical signal lines 47 are provided for each pixel and a column addition switch 72 is provided for connecting vertical signal lines 47 of interest. This makes it possible to perform reading simultaneously for each same color, which results in an increase in processing speed.

Second Variation

Figure 7B:
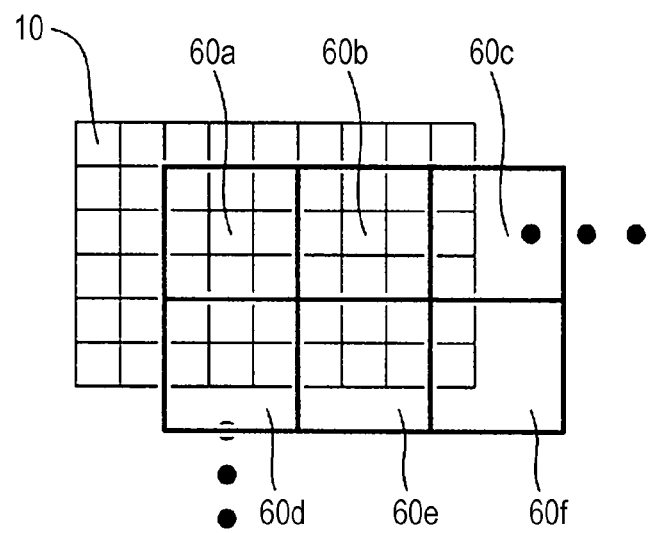
FIG. 7B illustrates an example of a pixel block to which a filter is applied.

FIG. 7B illustrates an example of a pixel array arrangement in a pixel block to which a filter is applied. As shown in FIG. 7B, the pixel block, to which the filter is applied, includes pixel groups each including 3×3 pixels, 4×4 pixels, or the like in which pixel blocks may be disposed directly adjacent to each other. FIG. 7B illustrates an example in which each pixel block includes a 3×3 pixel group. In FIG. 7B, six pixel blocks 60a to 60f to which the filter is applied are disposed adjacent to each other. By arranging the pixel blocks at locations adjacent to each other and putting the filter over the whole pixel array 70, it is possible to perform the convolution without losing image information, which allows a reduction in the number of pieces of output pixel data.

Figure 7C:
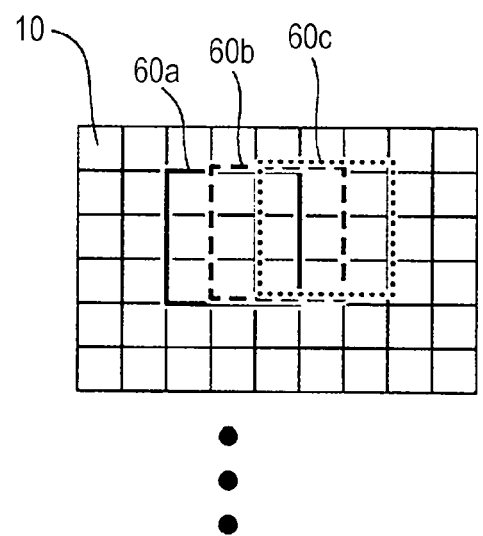
FIG. 7C illustrates another example of a pixel block to which a filter is applied.

FIG. 7C illustrates another example of an array of pixels in a pixel block to which a color filter is applied. As shown in FIG. 7C, the pixel block to which the filter is applied may be a pixel group including 3×3 pixels, 4×4 pixels, or the like and, the pixel block may be shifted repeatedly by one pixel at a time. In the example shown in FIG. 7C, the pixel block is given by a pixel group including a 3×3 pixels. In FIG. 7C, three pixel blocks 60a to 60c to which the filter is applied are disposed such that the pixel block 60b is at a location shifted by one pixel from the location of the pixel block 60a, and the pixel block 60c is at a location shifted by one pixel from the location of the pixel block 60b, and thus there are overlapping pixels. In the example shown in FIG. 7C, the number of pieces of output data is greater than in the case where the pixel blocks are disposed adjacent to each other with no overlapping as shown in FIG. 7B. However, the example shown in FIG. 7C has an advantage that it is possible to perform convolution for all pixel information.

The above-described convolution filters of various different types may be applied in a time division manner. That is, the filter may be switched among a plurality of filters in a time division manner, for example, such that a filter A is used in capturing an N-th frame, a filter B is used in capturing an (N+1)th frame, and so on.

Third Variation

Figure 8A:
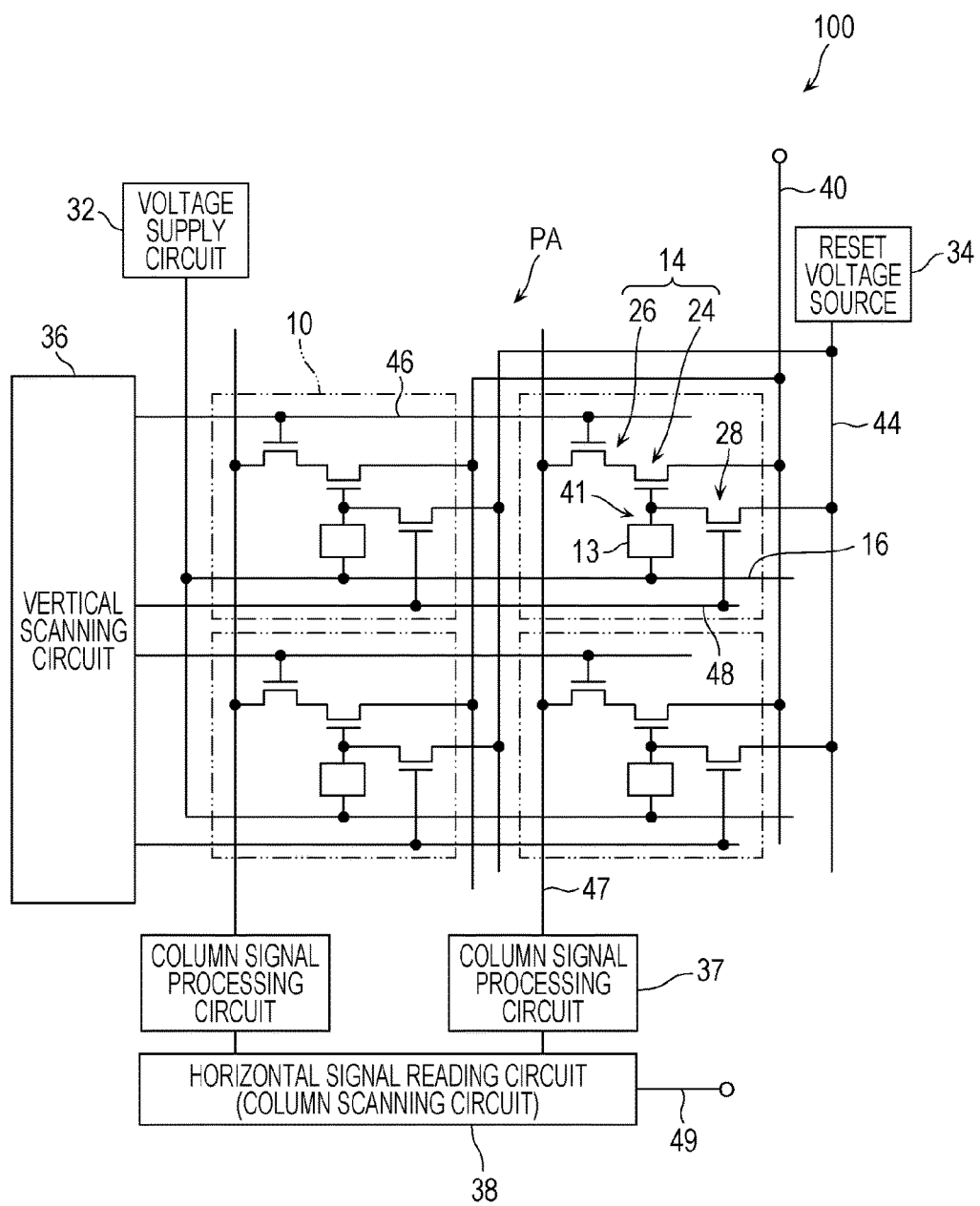
FIG. 8A is a diagram illustrating an example of a circuit configuration of an imaging device according to an embodiment of the present disclosure.

FIG. 8A is a diagram illustrating an example of a circuit configuration of the imaging device 100 according to an embodiment of the present disclosure. The imaging device 100 shown in FIG. 8A is an organic image sensor realized on a one-chip integrated circuit and includes a pixel array PA including a plurality of unit pixel cells 10 arranged in a two-dimensional form. In the example schematically illustrated in FIG. 8A, unit pixel cells 10 are arranged in the form of a 2×2 matrix. Note that the number of and the locations of the unit pixel cells 10 in the imaging device 100 are not limited to those in the example shown in FIG. 8A. In FIG. 8A, for convenience of illustration, a circuit (more specifically, a pixel electrode control circuit 33 shown later in FIG. 8B) for individually setting sensitivities of the unit pixel cells 10 is not shown.

Each unit pixel cell 10 includes a photoelectric converter 13 and a detection circuit 14. As described later with reference to FIG. 8B, the photoelectric converter 13 includes photoelectric conversion layer disposed between two electrodes facing each other and generates a signal charge in response to incident light. Note that it is not necessary to provide photoelectric converters 13 such that one whole photoelectric converter 13 is dedicated to one unit pixel cell 10, but part of the photoelectric converter 13 may be disposed over a plurality of unit pixel cells 10. The detection circuit 14 is a circuit that detects a signal charge generated by the photoelectric converter 13. In the present example, the detection circuit 14 includes a signal detection transistor 24 and an address transistor 26. The signal detection transistor 24 and the address transistor 26 each are typically a field effect transistor (FET). More specifically, in the present example, an N-channel MOSFET is used by way of example for each of the signal detection transistor 24 and the address transistor 26.

As schematically illustrated in FIG. 8A, a control terminal (more specifically, a gate in this case) of the signal detection transistor 24 has an electric connection to the photoelectric converter 13. A signal charge (holes or electros) generated by the photoelectric converter 13 is accumulated in a charge accumulation node 41 located between the gate of the signal detection transistor 24 and the photoelectric converter 13. The charge accumulation node 41 is also called a "floating diffusion node" or a "charge accumulation element". The structure of the photoelectric converter 13 will be described in further detail later. The photoelectric converter 13 of each unit pixel cell 10 is connected to an opposite electrode voltage line 16. The opposite electrode voltage line 16 is connected to an opposite electrode voltage supply circuit 32. Hereinafter, the opposite electrode voltage supply circuit 32 will be referred to simply as the "voltage supply circuit 32". The voltage supply circuit 32 is a circuit configured to supply an arbitrary variable voltage. When the imaging device 100 is in operation, the voltage supply circuit 32 supply a particular voltage to the photoelectric converter 13 via the opposite electrode voltage line 16. The voltage supply circuit 32 is not limited to a specific power supply circuit, but the voltage supply circuit 32 may be a circuit that generates the particular voltage or a circuit that converts a voltage supplied from another power supply to the particular voltage.

As described in detail later, the voltage supplied from the voltage supply circuit 32 to the photoelectric converter 13 is switched between a plurality of voltage values thereby controlling starting and ending of accumulation of the signal charge in the charge accumulation node 41 from the photoelectric converter 13. Note that a similar function may be achieved by controlling the voltage of the charge accumulation node 41 or the voltage of the pixel electrode 11. In other words, in the present embodiment of the disclosure, an operation of an electronic shutter is achieved by switching the voltage supplied from the voltage supply circuit 32 to the photoelectric converter 13 or by switching the initial voltage of the charge accumulation node 41 or the pixel electrode 11. A specific example of an operation of the imaging device 100 will be described later. In the configuration shown in FIG. 8A, the charge accumulation node 41 is connected to the pixel electrode 11, and thus they have the same electric potential.

Each unit pixel cell 10 is connected to a power supply line 40 via which a power supply voltage VDD is supplied. As shown in FIG. 8A, an input terminal (typically, a drain) of the signal detection transistor 24 is connected to the power supply line 40. The power supply line 40 functions as a source follower power supply and thus the signal detection transistor 24 amplifies the signal generated by the photoelectric converter 13 and outputs a resultant signal.

An output terminal (a source in this case) of the signal detection transistor 24 is connected to an input terminal (a drain in this case) of the address transistor 26. An output terminal (a source in this case) of the address transistor 26 is connected to one of a plurality of vertical signal lines 47 provided for respective columns of the pixel array PA. A control terminal (a gate in this case) of the address transistor 26 is connected to the address control line 46. By controlling the electric potential of the address control line 46, it is possible to selectively read the output of the signal detection transistor 24 to a corresponding vertical signal line 47.

In the example shown in FIG. 8A, the address control line 46 is connected to the vertical scanning circuit 36. The vertical scanning circuit 36 is also called a "row scanning circuit". The vertical scanning circuit 36 selects, on a row-by-row basis, a plurality of unit pixel cells 10 disposed in respective rows by applying a particular voltage to the address control line 46. As a result, reading of a signal from the selected unit pixel cell 10 and resetting of the pixel electrode are performed. The resetting of the pixel electrode is described in detail later.

The vertical signal line 47 is a main signal line which transmits a pixel signal from the pixel array PA to a peripheral circuit. The vertical signal line 47 is connected to a column signal processing circuit 37. The column signal processing circuit 37 is also called a "row signal accumulation circuit". The column signal processing circuit 37 performs processing including noise reduction signal processing typically using correlated double sampling, analog-to-digital (AD) conversion, and the like. As illustrated in FIG. 8A, one column signal processing circuit 37 is provided to each column of unit pixel cells 10 in the pixel array PA. The column signal processing circuit 37 is connected to a horizontal signal reading circuit 38. The horizontal signal reading circuit 38 is also called a "column scanning circuit". The horizontal signal reading circuit 38 reads signals sequentially from a plurality of column signal processing circuits 37 to a common horizontal signal line 49.

Each unit pixel cell 10 includes a reset transistor 28. The reset transistor 28 may be, for example, a field effect transistor as with the signal detection transistor 24 and the address transistor 26. Hereinafter, unless otherwise stated, it is assumed by way of example that an N-channel MOSFET is used as the reset transistor 28. As shown in FIG. 8A, the reset transistor 28 is connected between a reset voltage line 44 via which a reset voltage Vr is supplied and the charge accumulation node 41. A control terminal (a gate in this case) of the reset transistor 28 is connected to a reset control line 48. By controlling the electric potential of the reset control line 48, it is possible to reset the electric potential of the charge accumulation node 41 to the reset voltage Vr. In the present example, the reset control line 48 is connected to the vertical scanning circuit 36. By applying a particular voltage to the reset control line 48 from the vertical scanning circuit 36, it is possible to reset, in a row-by-row basis, a plurality of unit pixel cells 10 disposed in respective rows.

In the present example, the reset voltage line 44, via which the reset voltage Vr is supplied to the reset transistor 28, is connected to a reset voltage supply circuit 34. Hereinafter, the reset voltage supply circuit 34 is referred to simply as the "reset voltage source 34". As with the voltage supply circuit 32, the reset voltage source 34 is not limited to a specific power supply circuit as long as the reset voltage source 34 is capable of supplying the particular reset voltage Vr to the reset voltage line 44 in the operation of the imaging device 100. The voltage supply circuit 32 and the reset voltage source 34 each may be part of a single voltage supply circuit or may be an independent separate voltage supply circuit. One or both of the voltage supply circuit 32 and the reset voltage source 34 may be part of the vertical scanning circuit 36. Alternatively, the opposite electrode voltage from the voltage supply circuit 32 and/or the reset voltage Vr from the reset voltage source 34 may be supplied to each unit pixel cell 10 via the vertical scanning circuit 36.

As for the reset voltage Vr, the power supply voltage VDD of the detection circuit 14 may be employed. In this case, the voltage supply circuit (not shown in FIG. 8A) that supplies a power supply voltage to each unit pixel cell 10 and the reset voltage source 34 may share the same power supply circuit. Furthermore, the power supply line 40 and the reset voltage line 44 may share the same line, and thus it is possible to simplify interconnection lines in the pixel array PA. However, use of different voltages for the reset voltage Vr and the power supply voltage VDD of the detection circuit 14 makes it possible to control the imaging device 100 in a more flexible manner.

Figure 8B:
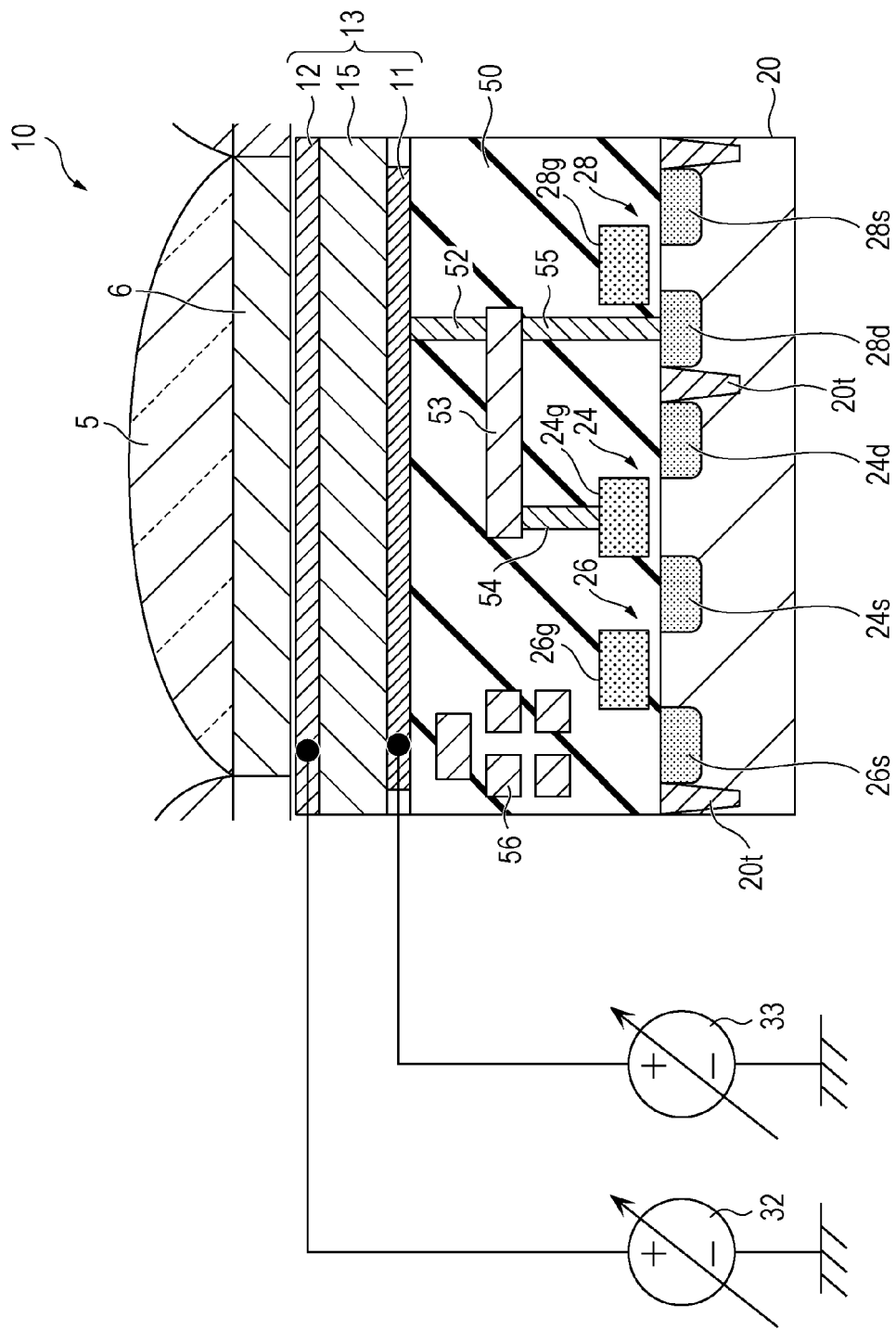
FIG. 8B schematically illustrates an example of a device structure of a unit pixel cell configured such that a sensitivity is variable according to a voltage applied to a pixel electrode.

FIG. 8B schematically illustrates an example of a device structure of the unit pixel cell 10. In the example of the structure shown in FIG. 8B, the signal detection transistor 24, the address transistor 26, and the reset transistor 28 are formed on a semiconductor substrate 20. The semiconductor substrate 20 is not limited to a substrate the whole of which is semiconductor. The semiconductor substrate 20 may be, for example, an insulating substrate on which a semiconductor layer is disposed such that the semiconductor layer is located on a substrate's surface where a photo-sensing region is formed. In the present example, a P-type silicon (Si) substrate is used as the semiconductor substrate 20.

The semiconductor substrate 20 includes impurity regions (N-type regions in the present example) 26s, 24s, 24d, 28d, and 28s and an element isolation region 20t for electrically isolating the unit pixel cells 10 from each other. In the present example, the element isolation region 20t is also provided between the impurity region 24d and the impurity region 28d. The element isolation region 20t may be produced, for example, by implanting acceptor ions under a particular implantation condition.

The impurity regions 26s, 24s, 24d, 28d, and 28s are typically diffusion layers formed in the semiconductor substrate 20. As schematically shown in FIG. 8B, the signal detection transistor 24 includes impurity regions 24s and 24d and a gate electrode 24g. The gate electrode 24g is typically a polysilicon electrode. The impurity regions 24s and 24d respectively function, for example, as a source region and a drain region of the signal detection transistor 24. A channel region of the signal detection transistor 24 is formed between the impurity regions 24s and 24d.

Similarly, the address transistor 26 includes the impurity regions 26s and 24s and a gate electrode 26g connected to the address control line 46. The gate electrode 26g is typically a polysilicon electrode. In the present example, the signal detection transistor 24 and the address transistor 26 share the impurity region 24s thereby being electrically connected to each other. The impurity region 26s functions, for example, as a source region of the address transistor 26. The impurity region 26s has a connection to the vertical signal line 47 which is not shown in FIG. 8B.

The reset transistor 28 includes the impurity regions 28d and 28s and a gate electrode 28g connected to the reset control line 48. The gate electrode 28g is typically a polysilicon electrode. The impurity region 28s functions, for example, a source region of the reset transistor 28. The impurity region 28s is connected to the reset voltage line 44 which is not shown in FIG. 8B.

An interlayer insulating layer 50 is disposed on the semiconductor substrate 20 so as to cover the signal detection transistor 24, the address transistor 26 and the reset transistor 28. The interlayer insulating layer 50 is typically silicon dioxide. As shown in FIG. 8B, an interconnection layer 56 may be disposed in the interlayer insulating layer 50. The interconnection layer 56 is formed typically of metal such as copper or the like, and may include, as part thereof, an interconnection line such as the vertical signal line 47 described above. The number of insulation layers in the interlayer insulating layer 50 and the number of interconnection layers 56 disposed in the interlayer insulating layer 50 are arbitrary, and they are not limited to those shown by way of example in FIG. 8B.

The photoelectric converter 13 described above is disposed on the interlayer insulating layer 50. In other words, In the present embodiment of the disclosure, a plurality of unit pixel cells 10 forming the pixel array PA are formed on the semiconductor substrate 20. A photo-sensing region (also referred to as a pixel region) is realized by the plurality of unit pixel cells 10 arranged in a two-dimensional form on the semiconductor substrate 20. The center-to-center distance (that is, the pixel pitch) between each two adjacent unit pixel cells 10 may be, for example, 2 µm.

The photoelectric converter 13 includes the pixel electrode 11, an opposite electrode 12, and a photoelectric conversion layer 15 disposed between the pixel electrode 11, and the opposite electrode 12. Note that the pixel electrode 11 is an example of a first electrode, and the opposite electrode 12 is an example of a second electrode. In the present example, the opposite electrode 12 and the photoelectric conversion layer 15 are formed over a plurality of unit pixel cells 10. As for the pixel electrode 11, one pixel electrode 11 is disposed in each unit pixel cell 10 such that the pixel electrode 11 is spatially separated from pixel electrodes 11 of adjacent other unit pixel cells 10. That is, the pixel electrode 11 is electrically isolated from pixel electrodes 11 of the other unit pixel cells 10.

The opposite electrode 12 is typically a transparent electrode formed of a transparent conductive material. The opposite electrode 12 is disposed on a side, on which light is incident, of the photoelectric conversion layer 15. Thus, light is incident on the photoelectric conversion layer 15 after passing through the opposite electrode 12. Note that light detected by the imaging device 100 is not limited to light in a visible wavelength range (for example, from 380 nm to 780 nm). In the present specification, the term "transparent" is used to represent being transparent to at least part of the wavelength to be detected, and does not necessarily mean being transparent over the whole visible wavelength range. In the present specification, for convenience, general electromagnetic waves including infrared rays and ultraviolet rays are referred to as "light". The opposite electrode 12 may be formed using a transparent conducting oxide (TCO) such as ITO, IZO, AZO, FTO, $SnO_2$, $TiO_2$, $ZnO_2$, or the like.

The photoelectric conversion layer 15 generates hole-electron pairs in response to incident light. The photoelectric conversion layer 15 is formed, typically, of an organic material (also referred to as an organic film). The organic material may include, for example, a junction structure of a p-type organic semiconductor and an n-type organic semiconductor. The p-type organic semiconductor may be, for example, an electron donating organic compound such as a triarylamine compound, a benzidine compound, a pyrazoline compound, or the like. The n-type organic semiconductor may be, for example, an electron accepting compound such as 5- to 7-membered heterocyclic compound containing nitrogen atom, oxygen atom, and sulfur atom, a condensed aromatic carbocyclic compound, a polyarylene compound, or the like.

The opposite electrode 12 has a connection to the opposite electrode voltage line 16 connected to the voltage supply circuit 32. Note that the opposite electrode 12 is formed so as to extend over a plurality of unit pixel cells 10. Therefore, it is possible to apply an opposite electrode voltage simultaneously to the plurality of unit pixel cell 10 from the voltage supply circuit 32 via the opposite electrode voltage line 16. In a case where it is allowed to apply a desired opposite electrode voltage from the voltage supply circuit 32, opposite electrodes 12 may be formed such that one opposite electrode is provided separately for each unit pixel cell 10. Similarly, one photoelectric conversion layer 15 may be provided separately for each unit pixel cell 10.

The pixel electrode 11 is connected to the pixel electrode control circuit 33. The pixel electrode control circuit 33 is configured to supply a variable arbitrary voltage. When the imaging device 100 is in operation, the pixel electrode control circuit 33 supplies a particular voltage to the pixel electrode 11 of the photoelectric converter 13. The pixel electrode control circuit 33 is not limited to a particular power supply circuit but may be a circuit that generates the particular voltage or a circuit that converts a voltage supplied from another power supply to the particular voltage.

As described in detail later, one or both of the voltage supply circuit 32 and the pixel electrode control circuit 33 supply a voltage to the photoelectric converter 13 such that the voltage is different between an exposure period and a non-exposure period thereby controlling the sensitivity of each pixel. In the present specification, the "exposure period" is a period in which a positive or negative charge generated via the photoelectric conversion (that is, a signal charge) is accumulated in the charge accumulation element, and thus this period may also be referred to as a "charge accumulation period". Furthermore, in the present specification, a period during the operation of the imaging device other than the exposure period is referred to as the "non-exposure period". Note that the "non-exposure period" is not limited to a period in which incident light to the photoelectric converter 13 is blocked but the non-exposure period may include a period in which light is incident on the photoelectric converter 13.

By controlling the electric potential of the opposite electrode 12 with respect to the electric potential of the pixel electrode 11, it is possible to collect, by the pixel electrode 11, either holes or electrons of the hole-electron pairs generated in the photoelectric conversion layer 15 through the photoelectric conversion. However, in a case where the opposite electrode 12 is formed over the whole area of the pixel array, it is difficult to control the collecting on a row-by-row basis or pixel-by-pixel basis. To handle this situation, the opposite electrode 12 may be patterned into a plurality of parts each corresponding to one pixel. However, in this case, it becomes necessary to provide additional interconnection lines for separately supplying voltages to the respective divided parts of the opposite electrode.

For example, in a case where holes are used as the signal charge, to selectively collet the holes by the pixel electrode 11, the potential of the opposite electrode 12 is set to be higher than the potential of the pixel electrode 11. In the following discussion, it is assumed by way of example that holes are used as the signal charge. Note that it is also possible to use electrons as the signal charge.

By applying a proper bias voltage between the opposite electrode 12 and the pixel electrode 11 facing the opposite electrode 12, it is possible for the pixel electrode 11 to collect either positive or negative charge generated via the photoelectric conversion in the photoelectric conversion layer 15. The pixel electrode 11 is formed, for example, of a metal such as aluminum, copper, or the like, a metal nitride, or an impurity-doped conductive polysilicon.

The pixel electrode 11 may be an opaque electrode. For example, by forming a TaN electrode with a thickness of 100 nm as the pixel electrode 11, it is possible to achieve high enough opaqueness. The opaqueness of the pixel electrode 11 makes it possible to prevent light passing through the photoelectric conversion layer 15 from being incident on channel regions or impurity regions of transistors formed in the semiconductor substrate 20. The transistors formed in the semiconductor substrate 20 are at least one of the signal detection transistor 24, the address transistor 26, and the reset transistor 28. Note that the interconnection layer 56 may be used to form a light blocking film in the interlayer insulating layer 50. By preventing light from being incident on the channel regions of the transistors formed in the semiconductor substrate 20, it is possible to prevent the transistors from having a shift in characteristic (for example, a change in threshold voltage). Furthermore, by preventing light from being incident on the impurity regions formed in the semiconductor substrate 20, it is possible to prevent noise intrusion due to an unintended photoelectric conversion in impurity regions. As described above, preventing light from being incident on the semiconductor substrate 20 results in an improvement in reliability of the imaging device 100.

As shown in FIG. 8B, the pixel electrode 11 is connected to the gate electrode 24g of the signal detection transistor 24 via a contact plug 52, an interconnection line 53, and the contact plug 54. In other words, the gate of the signal detection transistor 24 has an electric connection to the pixel electrode 11. The contact plug 52 and the interconnection line 53 are formed of a metal such as copper. The contact plug 52, the interconnection line 53, and the contact plug 54 make up at least part of the charge accumulation node 41 (see FIG. 8A) between the signal detection transistor 24 and the photoelectric converter 13. The interconnection line 53 may be part of the interconnection layer 56. Note that the pixel electrode 11 is also connected to the impurity region 28d via the contact plug 52, the interconnection line 53, and the contact plug 55. In the example of the configuration shown in FIG. 8B, the gate electrode 24g of the signal detection transistor 24, the contact plug 52, the interconnection line 53, the contact plugs 54 and 55, and the impurity region 28d serving as either the source region or the drain region of the reset transistor 28 function as the charge accumulation element in which the signal charge collected by the pixel electrode 11 is accumulated.

By collecting the signal charge by the pixel electrode 11, a voltage corresponding to the amount of the signal charge accumulated in the charge accumulation element is applied to the gate of the signal detection transistor 24. The signal detection transistor 24 amplifies this voltage. The voltage amplified by the signal detection transistor 24 is selectively read out as a signal voltage via the address transistor 26.

A color filter 6 and a microlens 5 are formed above the photoelectric converter 13. The color filter 6 is formed by patterning into an on-chip color filter and includes a photosensitive resin or the like in which a dye or a pigment is dispersed. The microlens 5 is formed, for example, as an on-chip microlens and includes an ultraviolet sensitive material or the like.

Figure 9:
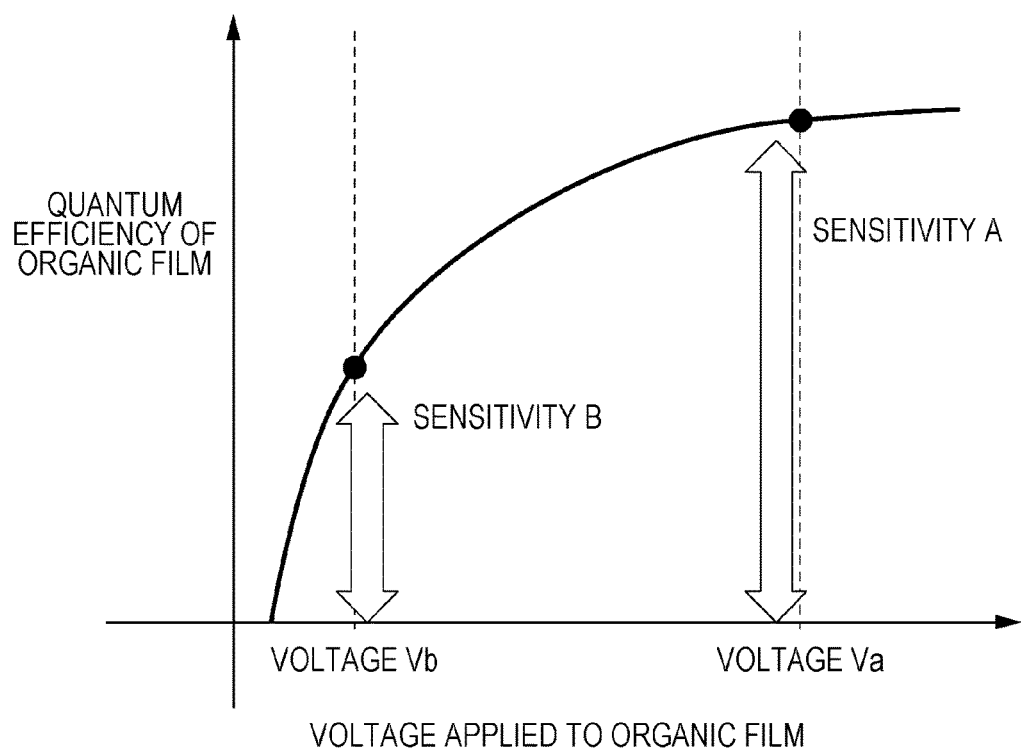
FIG. 9 illustrates an example of a dependence of a sensitivity of a photoelectric conversion layer on a voltage.

As shown in FIG. 8B, the electric potential of the pixel electrode 11 is controlled by the pixel electrode control circuit 33 provided individually for each unit pixel cell 10. This makes it possible to individually change the sensitivity of each pixel. For example, by simultaneously selecting an electric potential that results in a lowest sensitivity for all pixels, it is possible to achieve a global shutter function. The global shutter can be realized by controlling the voltage applied to the photoelectric conversion layer 15. Note that the global shutter can also be realized by controlling the electric potential of the opposite electrode 12 by using the voltage supply circuit 32. However, in this case, it is necessary to divide the opposite electrode 12 into a plurality of pieces corresponding to the respective pixels. FIG. 9 illustrates an example of a voltage dependence of the sensitivity of the photoelectric conversion layer 15. When a voltage Va is applied to an organic film forming the photoelectric conversion layer 15, the photoelectric conversion layer 15 has a sensitivity A, while when a voltage Vb lower than the voltage Va is applied to, the photoelectric conversion layer 15 has a sensitivity B.

Figure 10:
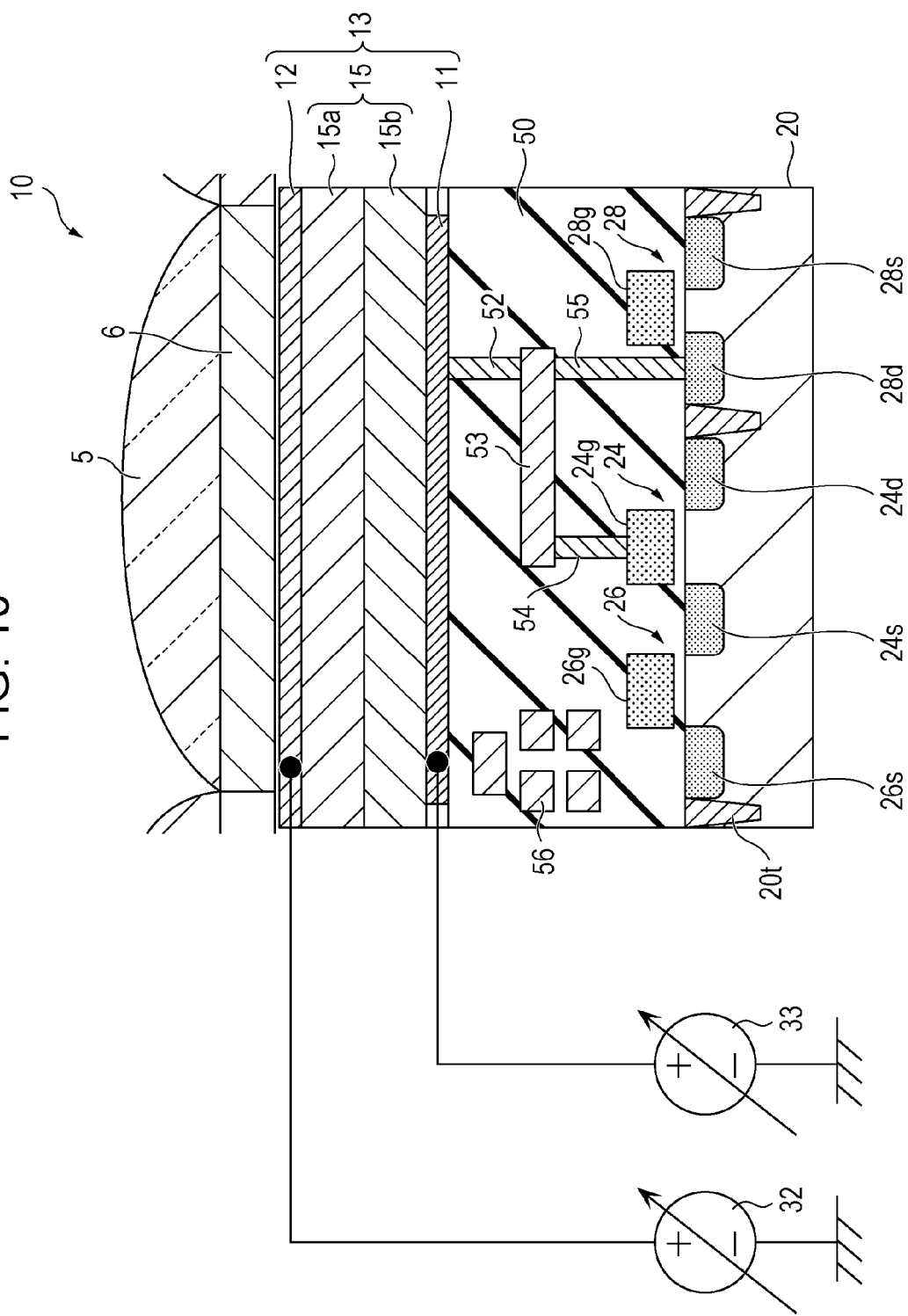
FIG. 10 schematically illustrates an example of a device structure of a unit pixel cell configured such that a sensitivity is variable according to a voltage applied to a pixel electrode using a photoelectric conversion layer having a multilayer structure.

The setting of the sensitivity of each pixel may be performed not only in a case where the photoelectric conversion layer 15 has a single layer structure but also in a case where the photoelectric conversion layer 15 includes two layers having different spectral sensitivity characteristics as shown in FIG. 10. The spectral sensitivity characteristic means a sensitivity characteristic represented as a function of the wavelength of incident light. In FIG. 10, the photoelectric conversion layer 15 includes two photoelectric conversion layers, that is, a photoelectric conversion layer 15a and a photoelectric conversion layer 15b which are different in spectral sensitivity characteristic. In the multilayer structure including the photoelectric conversion layers 15a and 15b which are different in spectral sensitivity characteristic, by setting the sensitivity by controlling the applied voltage, it becomes possible to perform convolution of wavelength information. The photoelectric conversion layer 15 may be formed in the multilayer structure including two or more layers which are simply different only in sensitivity.

First Circuit Configuration

Figure 11:
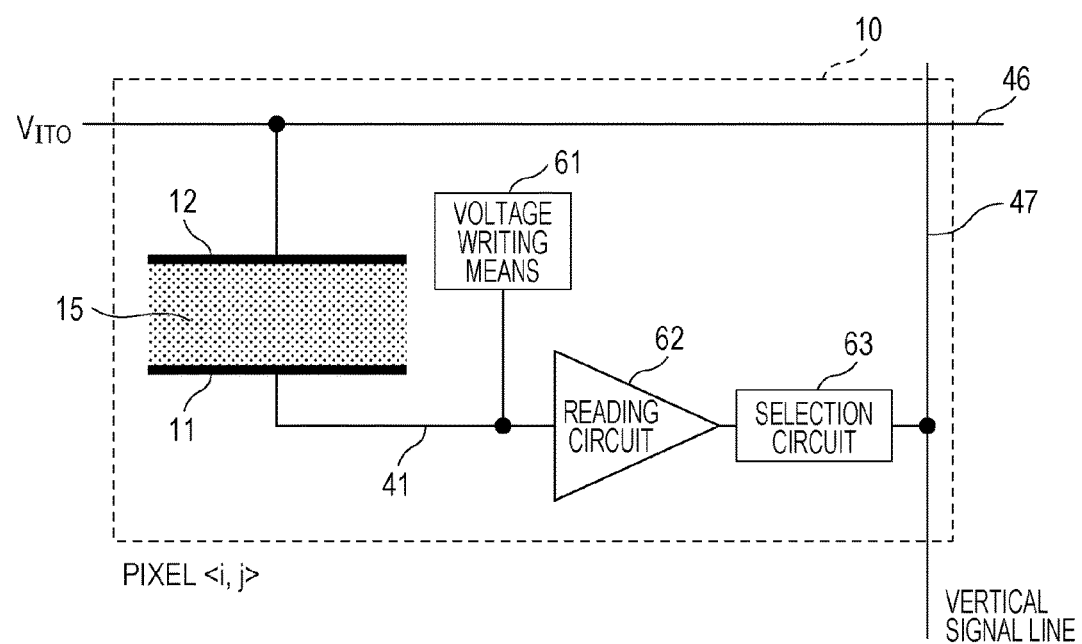
FIG. 11 schematically illustrates an example of a circuit of a unit pixel cell configured such that a sensitivity is variable according to a voltage applied to pixel electrode.

FIG. 11 schematically illustrates an example of a circuit of the unit pixel cell 10 configured such that the sensitivity is set by controlling the electric potential of the pixel electrode 11. The pixel electrode 11 is connected to a voltage writing means 61 including a voltage applying circuit and also connected to a reading circuit 62 configured to reach out a signal. The signal output from the reading circuit 62 is output to the vertical signal line 47 via a selection circuit 63. The voltage writing means 61 corresponds to the pixel electrode control circuit 33 in FIG. 8B, and the reading circuit 62 corresponds to the signal detection transistor 24 in FIG. 8A. The selection circuit 63 corresponds to the address transistor 26 in FIG. 8A. The voltage writing means 61 initializes the electric potential of the charge accumulation node 41 to an arbitrary voltage. That is, it is possible to set, to an arbitrary value, the electric potential of the charge accumulation node 41, that is, the electric potential of the pixel electrode 11 at point of time when the charge accumulation period is starts. This makes it possible to arbitrarily set the sensitivity of the unit pixel cell 10 which allows it to start the exposure with the arbitrary sensitivity. By setting the electric potential of the charge accumulation node 41 to an arbitrary value by using the voltage writing means 61, it is possible to control the voltage applied to the photoelectric conversion layer 15 thereby controlling the sensitivity of each pixel. The voltage writing means 61 may reset the electric potential of the charge accumulation node 41 to an arbitrary voltage such as the power supply voltage, or a voltage supplied from the outside via the reset means may be written to the charge accumulation node 41. Note that in a case where light is not incident at all over the entire charge accumulation period, the electric potential difference at the start of the charge accumulation period between the opposite electrode 12 and the pixel electrode 11, that is, the voltage applied to the photoelectric conversion layer 15 is maintained until the end of the charge accumulation period. The electric potential of the pixel electrode 11 at the start of the charge accumulation period is also maintained until the end of the charge accumulation period.

Second Circuit Configuration

Figure 12:
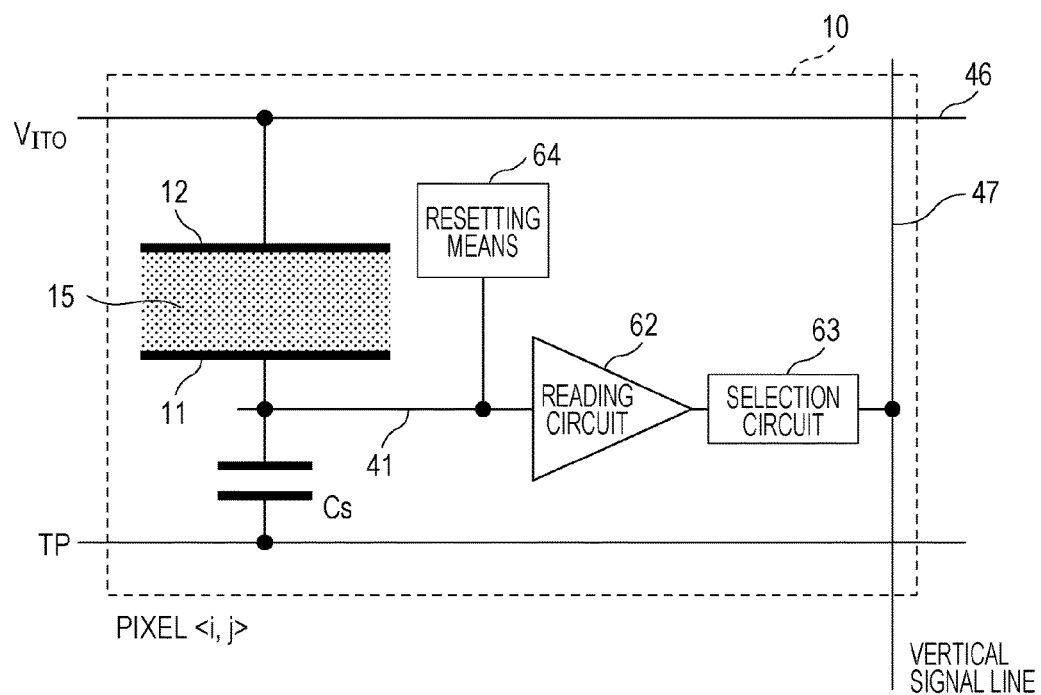
FIG. 12 schematically illustrates an example of a circuit of a unit pixel cell including a capacitor connected to a charge accumulation node.

FIG. 12 schematically illustrates an example of a circuit of a unit pixel cell 10 including a capacitor CS connected to the charge accumulation node 41. The charge accumulation node 41 is connected, via the capacitor CS, to a signal line TP extending in a row direction. By applying a pulse voltage to the signal line TP, it is possible to arbitrarily set the electric potential of the charge accumulation node 41 via coupling through the capacitor CS, thereby controlling the voltage applied to the photoelectric conversion layer 15. For example, when the voltage of the signal line TP is changed from a LOW level to a HIGH level, the voltage of the charge accumulation node 41 increases depending on the capacitance of the charge accumulation node 41 and the capacitance of the capacitor CS. By arbitrarily setting the voltage applied to the signal line TP in the charge accumulation period in the above-described manner, it is possible to set, to an arbitrary value, the electric potential of the charge accumulation node 41, that is, the electric potential of the pixel electrode 11 at the start of the charge accumulation period, and thus it is possible to arbitrarily set the sensitivity of the unit pixel cell 10. It is possible to reduce the voltage amplitude of the signal line TP to be controlled by increasing the capacitance of the capacitor CS. For small-size pixels, the voltage amplitude of the signal line TP may be increased, and the size of the capacitor CS may be reduced. In the present circuit configuration, providing individual signal lines TP in respective rows makes it possible to achieve a rolling shutting operation. More specifically, by controlling the electric potential difference applied to the photoelectric conversion layer 15 such that the sensitivity of the photoelectric conversion is equal to zero, it is possible to achieve the rolling shutter. By controlling the electric potential difference applied to the photoelectric conversion layer 15 such that the sensitivity of the photoelectric conversion is equal to a desired value, it is possible to achieve a variable rolling sensitivity. More specifically, for example, by switching, on a row-by-row basis, between a state in which the sensitivity is zero and a state in which the sensitivity is normal, it is possible to achieve a row-by-row exposure as with the conventional rolling shutter. Note that when the electric potential of the charge accumulation node 41 is raised via the capacitor CS in an exposure operation, there is a possibility that the electric potential of the charge accumulation node 41 becomes too high with reference to the operating voltage range of the reading circuit 62 during the operation of reading the accumulated charge, which may make it difficult to properly reading the accumulated charge. To handle this situation, the power supply voltage of the reading circuit 62 may be increased. However, this results in an increase in power consumption. To avoid this situation, the voltage of the signal line TP in the exposure period may be increased, and the voltage of the signal line TP may be reduced in a following reading period. This results in a reduction in the electric potential of the charge accumulation node 41 in the reading period, and thus it becomes possible to read out the accumulated charge without increasing the power supply voltage of the reading circuit 62.

Third Circuit Configuration

Figure 13:
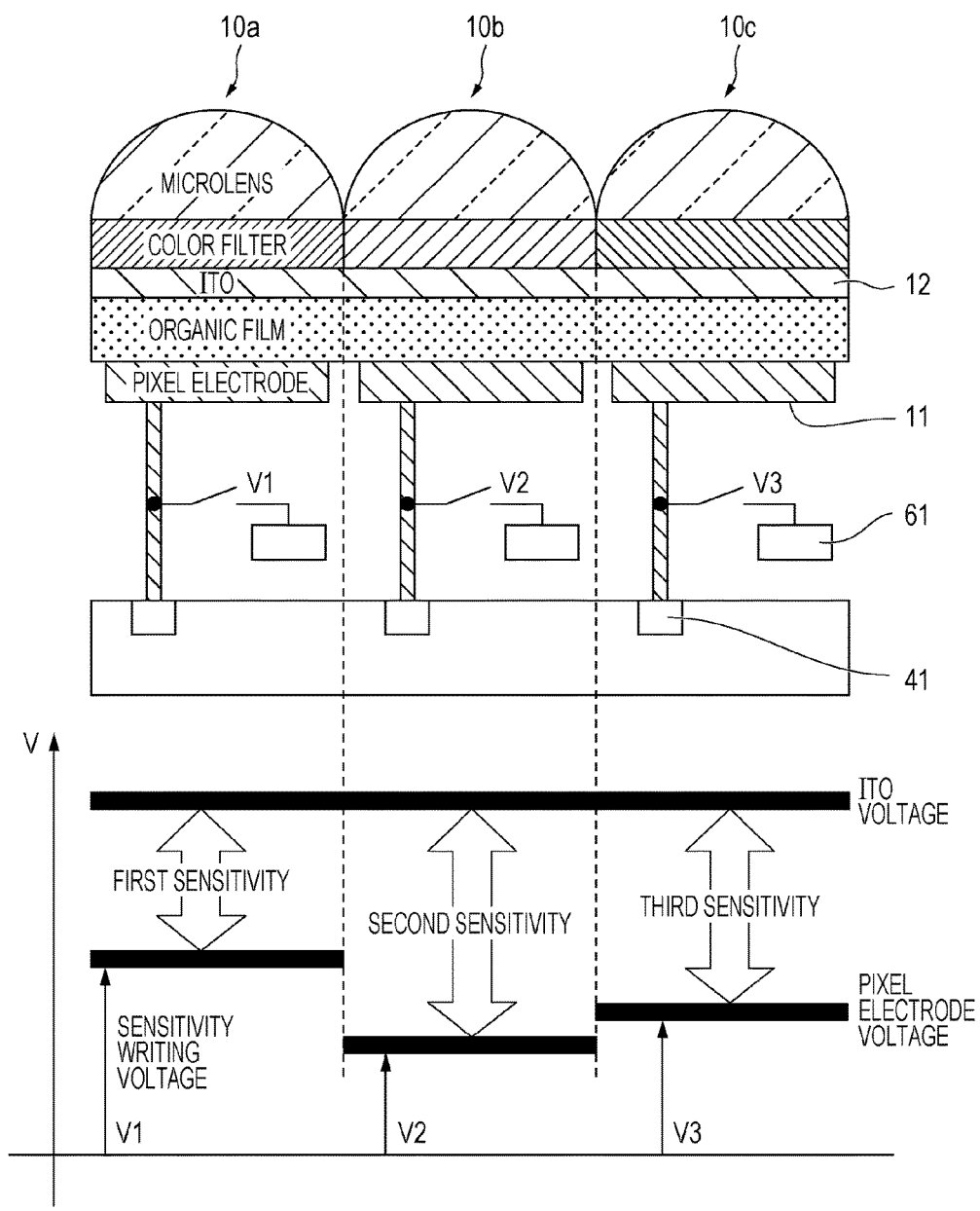
FIG. 13 illustrates a voltage diagram in a state in which a sensitivity is set on a pixel-by-pixel basis.

FIG. 13 illustrates a voltage diagram for a case in which the sensitivity is changed on a pixel-by-pixel basis. The reset voltage for setting the sensitivity is written to the pixel electrode 11 of each of the pixels 10a to 10c by the voltage writing means 61 provided inside or outside the pixel. In FIG. 13, as for the pixel 10a, a voltage V1 is written to set the pixel 10a to have a first sensitivity. As for the pixel 10b adjacent to the pixel 10a, a voltage V2 is written to set the pixel 10b to have a second sensitivity. As for the pixel 10c adjacent to the pixel 10b, a voltage V3 is written to set the pixel 10c to have a third sensitivity. By setting the sensitivity individually for each pixel in the above-described manner, it is possible to set the filter coefficient in the convolution (that is, the operation coefficient) individually for each pixel.

Fourth Circuit Configuration

Figure 14:
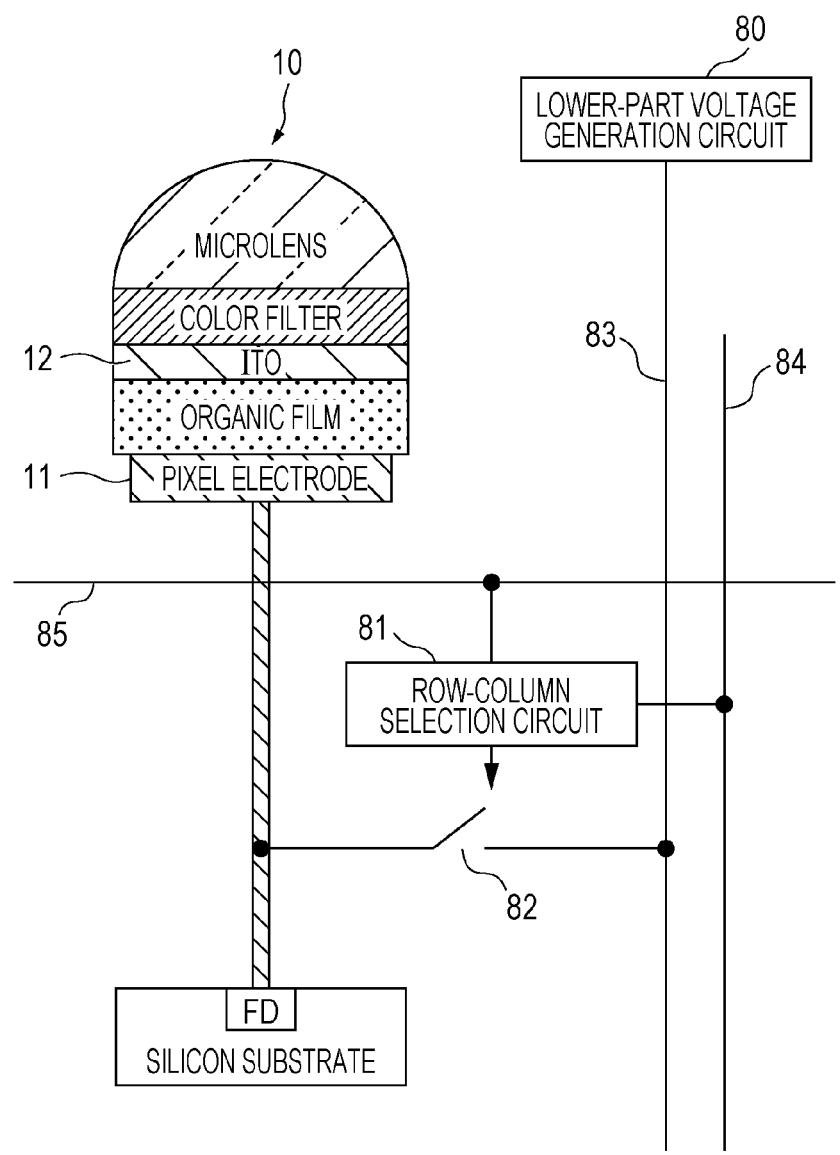
FIG. 14 illustrates an example of a basic circuit of an active matrix configuration configured such that a voltage is written to each pixel to set a sensitivity of the pixel.

FIG. 14 illustrates an example of a basic circuit of an active matrix configuration configured such that a voltage is written to each pixel to individually set a sensitivity of each pixel. The voltage may be applied to the pixel electrode 11, as shown in FIG. 14, by an active matrix method using a horizontal control line 85 and a vertical control line 84. Control signals are applied, from horizontal and vertical directions, to a pixel the sensitivity of which is to be set thereby supplying the control signals to a row-column selection circuit 81 provided for each pixel. When control signals are input to the row-column selection circuit 81 from both horizontal and vertical directions, that is, when the row-column selection circuit 81 is activated, the row-column selection circuit 81 turns on an in-pixel switch 82. As a result of this operation of the row-column selection circuit 81, an electric potential supplied from a lower-part voltage generation circuit 80 disposed outside the pixel array PA is applied to the pixel electrode 11 via a lower-part voltage line 83 and the in-pixel switch 82. By this active matrix method, it is possible to select an arbitrary pixel 10 in the pixel array PA and change the voltage of the pixel electrode 11 of the selected pixel 10. When the voltage is being written to the pixel electrode 11, the voltage of the opposite electrode 12 may be set to the low level thereby closing the shutter such that exposure does not start after the end of the writing of the voltage.

Fifth Circuit Configuration

Figure 15:
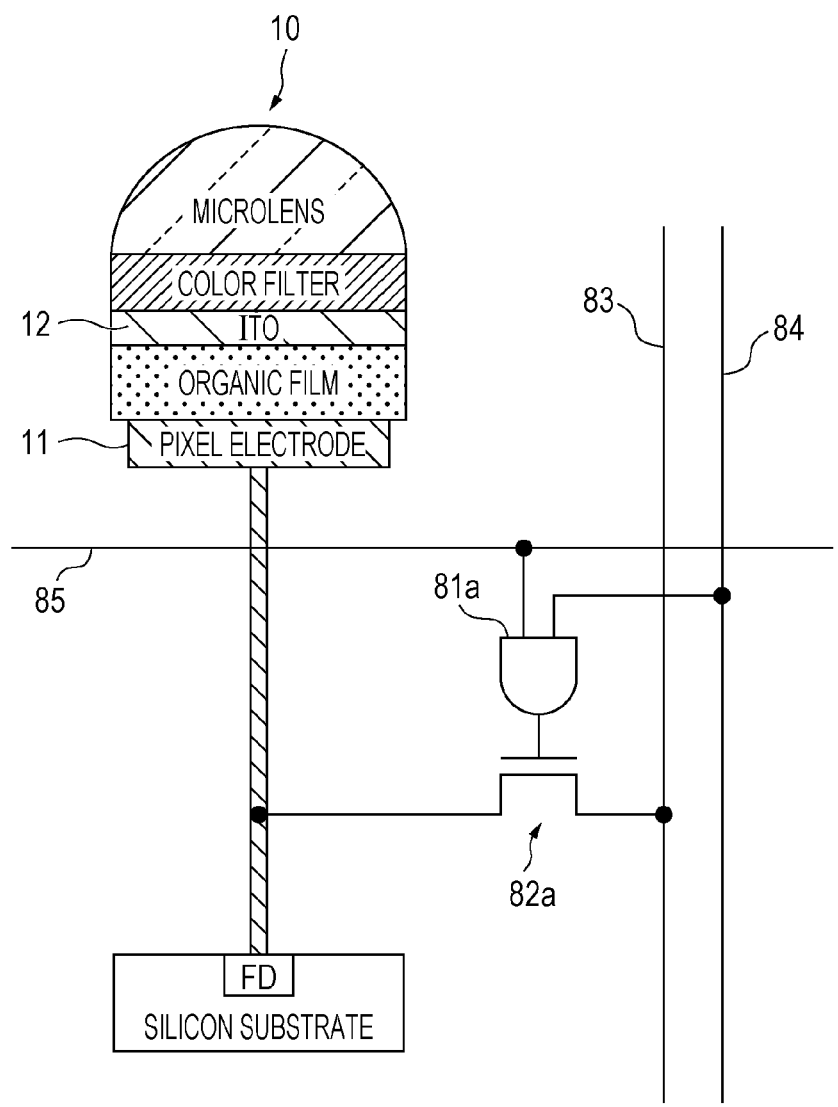
FIG. 15 illustrates a specific example of a circuit of an active matrix configuration configured such that a voltage is written to each pixel to set a sensitivity of the pixel.

FIG. 15 illustrates a specific example of a circuit of an active matrix configuration configured such that a voltage is written to each pixel to individually set the sensitivity of the pixel. As show in FIG. 15, an AND circuit 81a is used here as a specific example of the row-column selection circuit 81 shown in FIG. 14, and a transistor 82a is used as a specific example of the in-pixel switch 82 shown in FIG. 14. In a case where the AND circuit 81a is used, the AND circuit is typically realized using a NAND circuit and an inverter circuit, and thus a large number of elements are necessary. Here, the number of elements is, for example, the number of transistors. To handle this situation, a NAND circuit may be used instead of the AND circuit 81*a*, and a low-level voltage may be used, instead of a high-level voltage, to activate the row-column selection circuit.

Sixth Circuit Configuration

Figure 16:
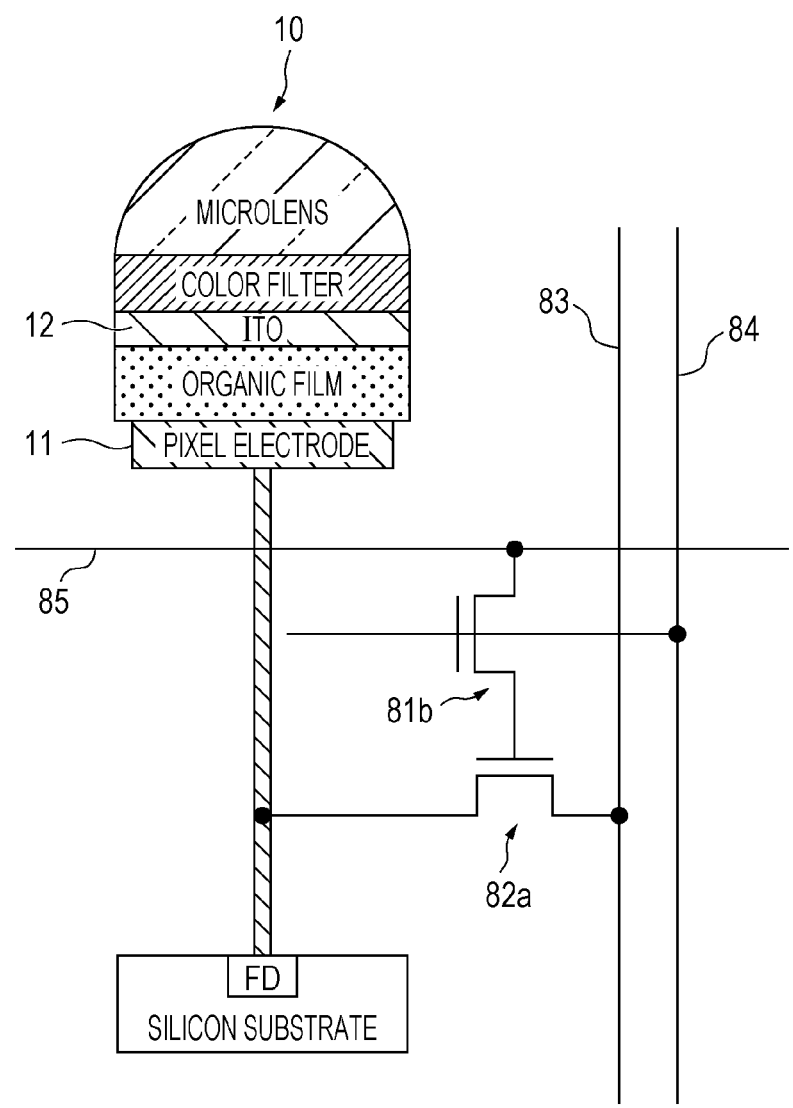
FIG. 16 illustrates another specific example of a circuit of an active matrix configuration configured such that a voltage is written to each pixel to set a sensitivity of the pixel.

FIG. 16 illustrates another specific example of a circuit of an active matrix configuration configured such that a voltage is written to each pixel to individually set the sensitivity of the pixel. In this example, the number of elements is further reduced from that used in the circuit shown in FIG. 15. More specifically, in this example, one NMOS transistor 81*b* is used as a specific example of the row-column selection circuit 81 shown in FIG. 14. In this example, by adding only two transistors 81*b* and 82*b* to the pixel, it is possible to achieve an active matrix configuration.

Seventh Circuit Configuration

Figure 17:
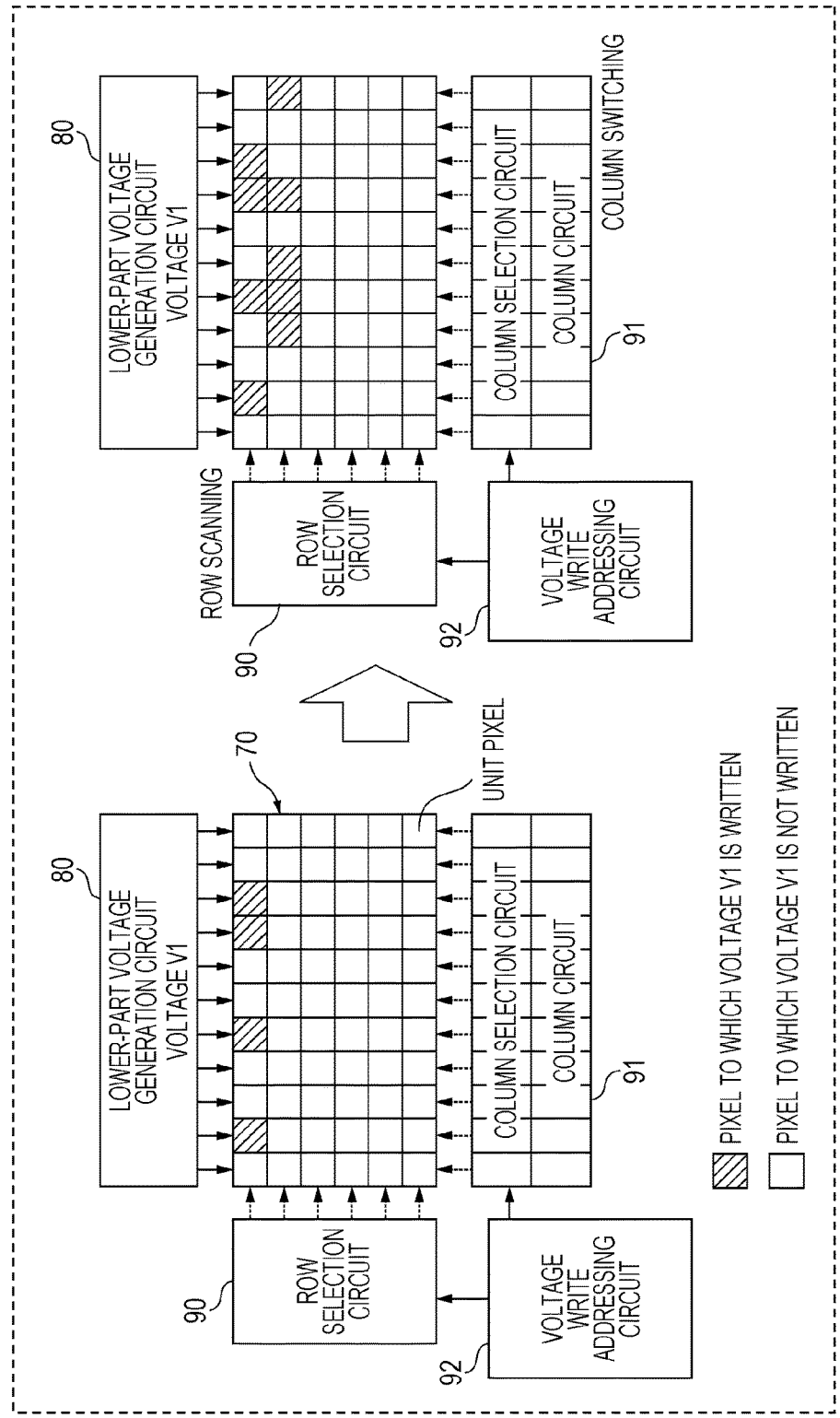
FIG. 17 illustrates an example of a sequence of writing a voltage to a pixel electrode in an active matrix configuration.

FIG. 17 illustrates an example of a sequence of writing a voltage of a pixel electrode 11 in an active matrix configuration. A lower-part voltage generation circuit 80 applies, to the pixel array 70, an arbitrary voltage for determining an electric potential of the pixel electrode 11. A voltage write addressing circuit 92 supplies, to a row selection circuit 90 and a column selection circuit 91, information indicating an address of a pixel to which the voltage is written. At a time, the row selection circuit 90 selects a first row and the column selection circuit 91 selects a particular column, the voltage is written at a pixel in this particular column and in the first row. After the writing of the voltage is completed, the row selection circuit 90 selects a second row, and the column selection circuit 91 selects a desired column. The lower-part voltage generation circuit 80 writes a voltage 1 at a pixel specified by the voltage write addressing circuit 92. This operation is performed for respective rows from the first to the last row, and then the lower-part voltage generation circuit 80 changes the voltage to a voltage 2 corresponding to the sensitivity to be set next, and the lower-part voltage generation circuit 80 writes the voltage sequentially at specified pixels in a similar manner as with the voltage 1.

Note that the voltage write addressing circuit 92 may be disposed on an image sensor chip or may be disposed separately outside the chip.

Note that the voltage write sequence is not limited to that on the row-by-row basis described above with reference to FIG. 17. For example, the voltage may be written simultaneously for all pixels of the pixel array 70, which may result in a reduction in the writing time. In this case, after all pixels are set to the same voltage once, one or more particular pixels may be selected, and another voltage may be overwritten sequentially at the selected pixels, which may result in an increase in a writing speed and a reduction in power consumption.

Fourth Variation

Figure 18:
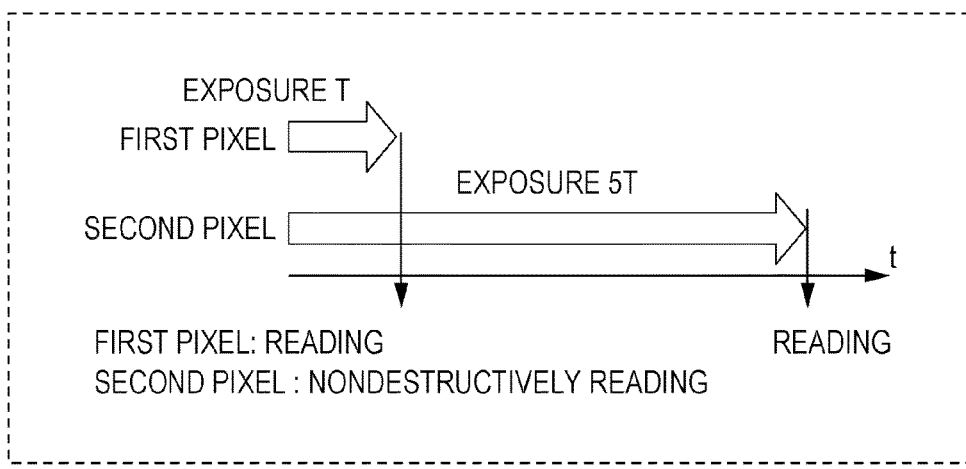
FIG. 18 illustrates an example of a method of setting a sensitivity by controlling an exposure time.

FIG. 18 illustrates an example of a method of setting a sensitivity by controlling an exposure time. This method of setting sensitivity by controlling the exposure time may be used alone or in combination with the above-described sensitivity setting method by controlling the voltage applied to the photoelectric conversion layer. In the organic image sensor, charge generated in an organic film is converted to a voltage, and the resultant voltage is read out by the reading circuit. That is, an accumulated charge is read out nondestructively. Here, let it be assumed that a first pixel is to be multiplied by an operation coefficient "1" and a second pixel is to be multiplied by an operation coefficient "5" as shown in FIG. 18. In this case, the first pixel is read out at an exposure time T and the second pixel is nondestructively read out. The second pixel is further continued to be subjected to the exposure, and the second pixel is read out when the exposure time reaches 5T. As a result, the ratio of the sensitivity of the first pixel to the sensitivity of the second pixel is set to 5.

Figure 19:
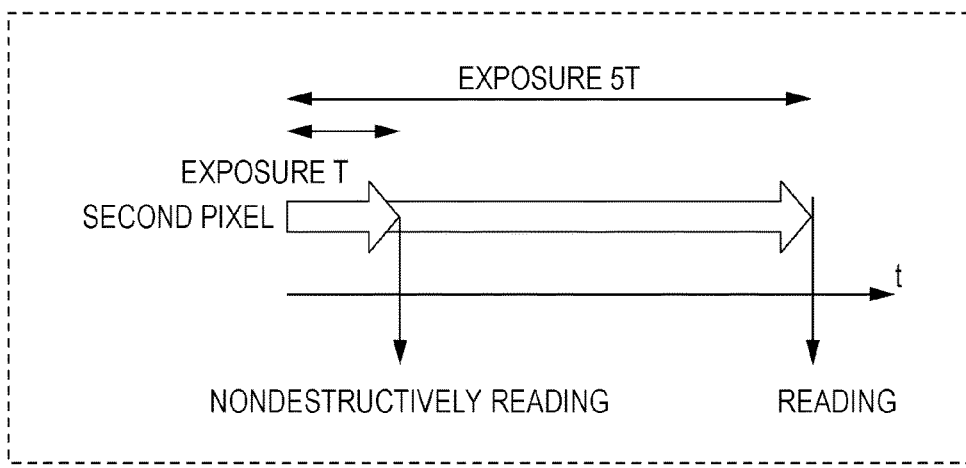
FIG. 19 illustrates another example of a method of setting a sensitivity by controlling an exposure time.

FIG. 19 illustrates another example of a method of setting the sensitivity by controlling the exposure time. In this example, at an exposure time T, data is destructively read out not only from the first pixel but also from the second pixel and the read-out data is stored. Thereafter, exposure with an additional exposure time 4T and reading are performed in the second pixel. In the second pixel, an exposure signal of the exposure time 1T and an exposure signal of the exposure time 4T may be added together thereby acquiring an exposure signal of a total of exposure time 5T. In this case, when data is read out from the second pixel at reading timing at which data is read out also from the first pixel, the reading is performed in a normal destructive manner for both pixels. Thus, it is possible to read all pixels at the same time without performing an address selection operation to select a pixel to be accessed. It is sufficient to perform an address selection operation to select a pixel to be read only at the end of the exposure with the exposure time 4T, which makes it possible to simplify the driving system.

Fifth Variation

Figure 20:
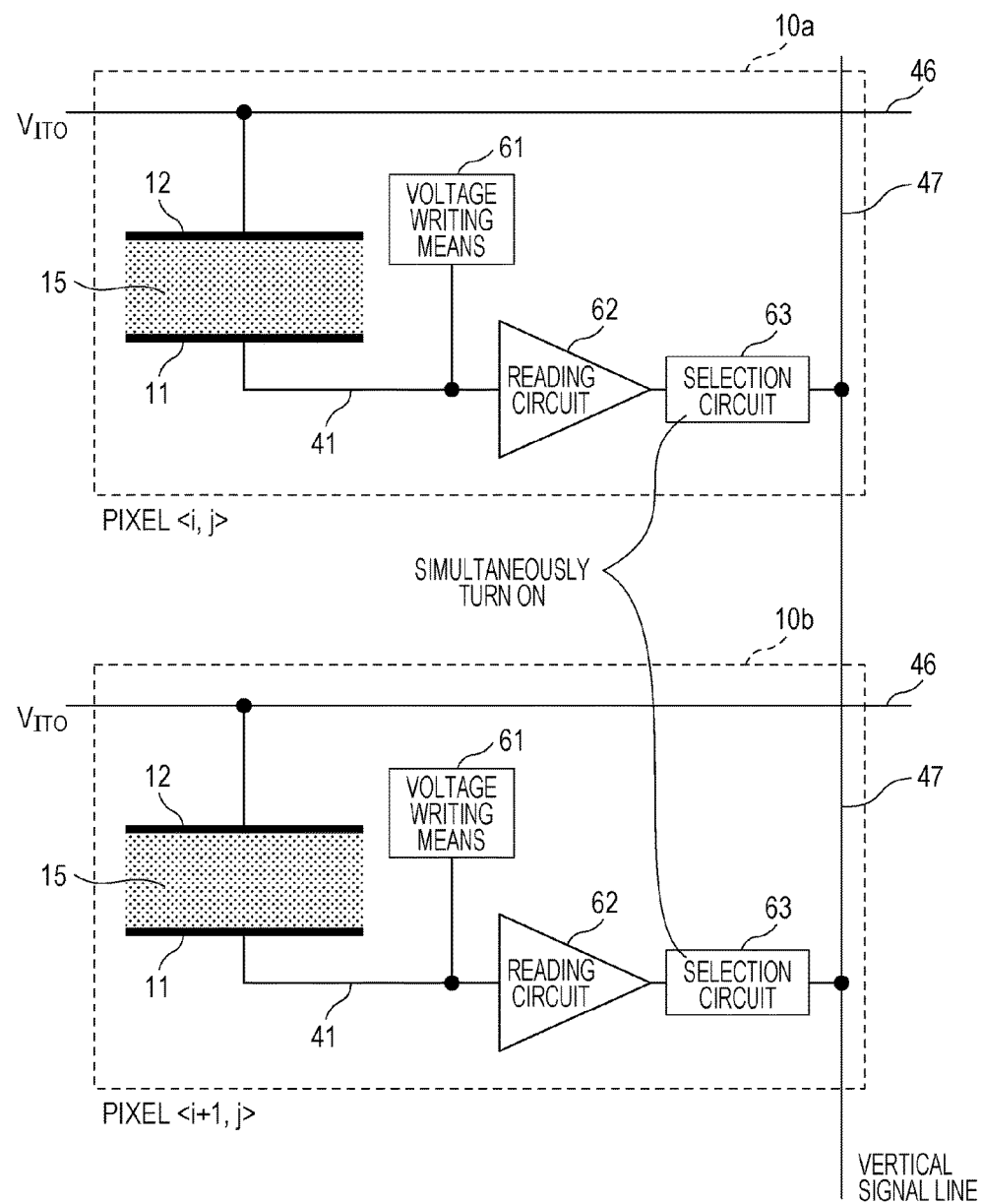
FIG. 20 illustrates an example of a pixel addition process performed at an output side of a reading circuit.

FIG. 20 illustrates an example of a pixel addition process performed at the output side of the reading circuit 62. In each of pixels <i, j> and <i+1, j>, the pixel electrode 11 is set to an arbitrary voltage by the voltage writing means 61 such that charge is accumulated with a particular sensitivity. The sensitivity may be equal or different between these two pixels. A reset level and a signal level are read out respectively before and after the charge accumulation period in each of the two pixels as described below. To add together two pixels 10*a* and 10*b* connected in the same arbitrary column, the selection circuits 63 of these two pixels are turned on (into the ON-state) at the same time and signals are output from these two pixels to the vertical signal line 47. As a result, the signals from the two pixels are added together on the vertical signal line 47. In this case, the vertical signal line 47 functions as an addition circuit that adds together signals output from a plurality of pixels. Signals from two pixels are added together and output via only one reading operation. However, this reading method may have a problem due to nonlinearity or the like of the reading circuit 62. To handle this situation, the selection circuits 63 may be simultaneously turned on when the reset levels are acquired and when the pixel signals are acquired, the acquired reset levels may be subtracted from the corresponding respective acquired pixel signals. This makes it possible to remove a fixed offset component, which results in a reduction in influence of the nonlinearity. Note that each selection circuit 63 may be disposed in the corresponding reading circuit 62, and the reading circuit 62 may be activated only when the reading is performed. In this case, the selection circuits 63 in FIG. 20 may be removed.

Figure 21:
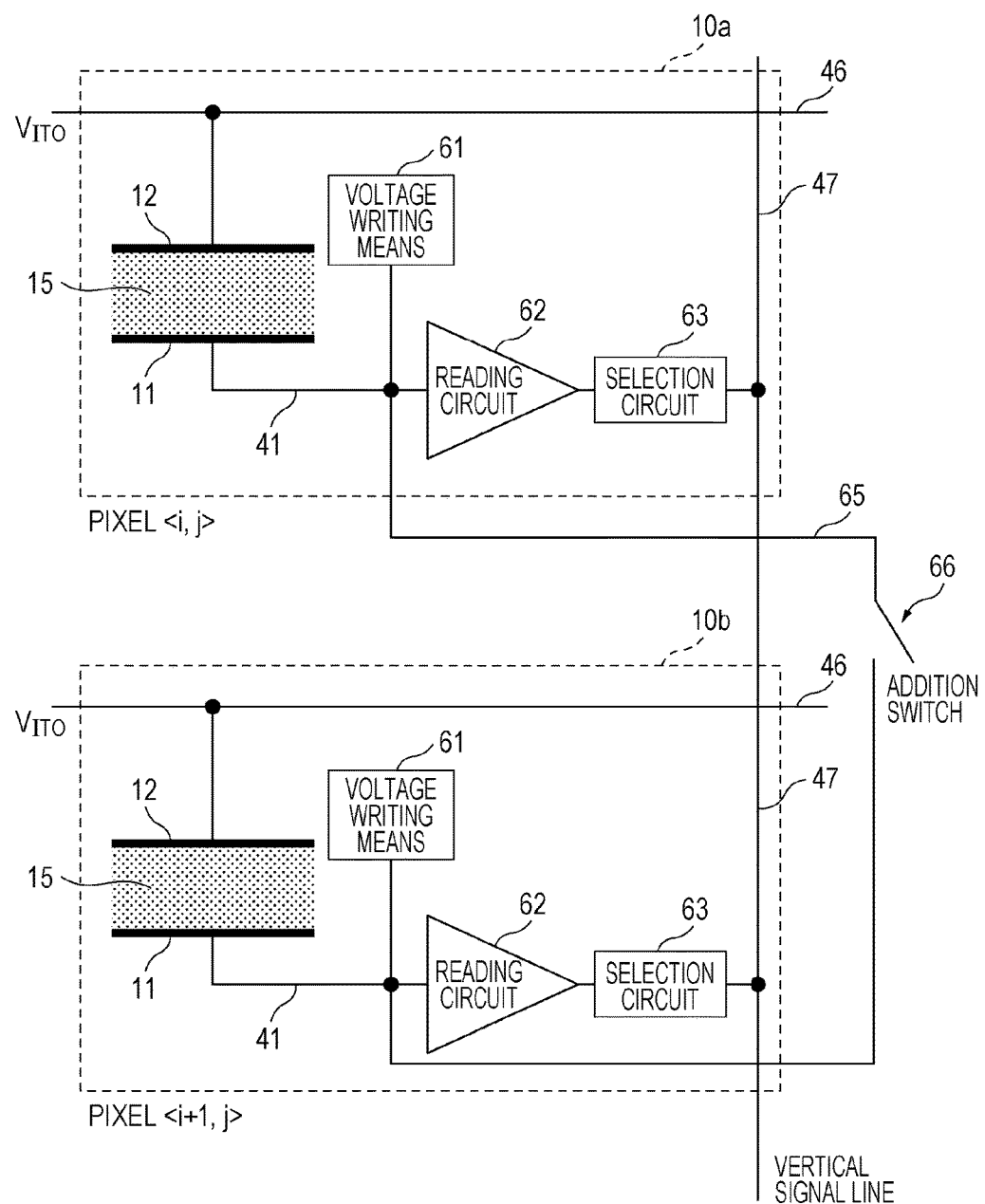
FIG. 21 illustrates an example of a pixel addition process performed at a charge accumulation node.

FIG. 21 illustrates an example of a pixel addition process performed at the charge accumulation node 41. The addition is performed not at the output side of the reading circuit 62, but the addition is achieved by connecting together floating diffusion nodes FD of pixels to be added together. That is, the floating diffusion nodes FD of the pixels 10*a* and 10*b* are connected via a connection line 65 and an addition switch 66, and only the selection circuit 63 of either one of the pixels is turned on thereby reading the added signal. In this case, the connection line 65 and the addition switch 66 function as an addition circuit that adds together signals output from a plurality of pixels. This pixel addition method needs additional elements including the addition switch 66 and the connection line 65 which are not needed in the reading method described above with reference to FIG. 20. However, the influence of the nonlinearity of the reading circuit 62 is low. Furthermore, only one of reading circuits 62 is used, it is possible to achieve a reduction in power consumption. Note that the addition switch 66 is not necessarily needed, and floating diffusion nodes FD of pixels to be added may be directly connected via the connection line 65 without using the addition switch 66. In this case, these pixels are always subjected to the signal addition.

Figure 22:
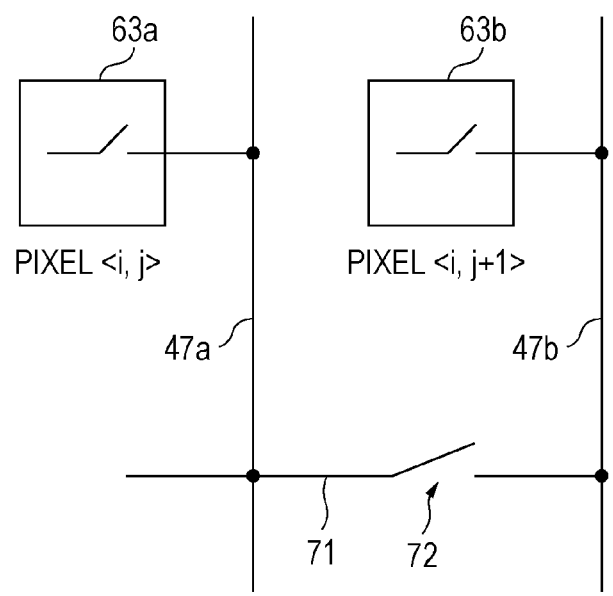
FIG. 22 illustrates an example of a pixel addition process performed between two columns.

FIG. 22 illustrates an example of a pixel addition process performed between two columns. To make it possible to add together pixel values of horizontally adjacent pixels, a connection line 71 and a column addition switch 72 may be provided between columns. When the column addition switch 72 is in the ON state, if selection circuits 63 of respective pixels <i, j> and <i, j+1> are simultaneously turned on, pixel values of these pixels are added together via the vertical signal lines 47a and 47b, the connection line 71, and the column addition switch 72. In this case, the connection line 71 and the column addition switch 72 function as an addition circuit that adds together signals output from a plurality of pixels. Note that the column addition switch 72 is not necessarily needed, but the vertical signal line 47a and the vertical signal line 47b may be directly connected via the connection line 71 without using the column addition switch 72. In this case, when the selection circuits 63 of the respective pixels <i, j> and <i, j+1> are simultaneously turned on, the pixel values of the pixels <i, j> and <i, j+1> are always added together.

Figure 23:
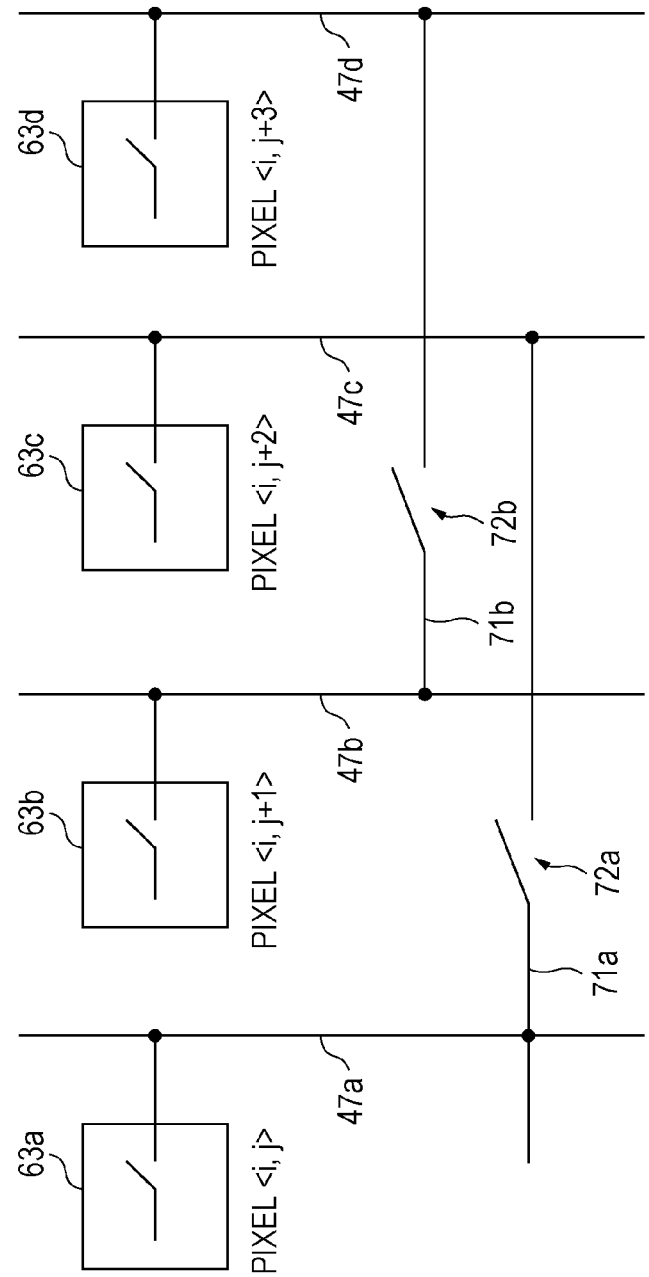
FIG. 23 illustrates an example of a pixel addition process performed between two columns between which there is another intervening column.

FIG. 23 illustrates an example of a pixel addition process performed between two columns between which one intervening column exist. In a case where pixels of interest to be added together are apart from each other in a horizontal direction, adding may be performed as shown in FIG. 23. That is, a pixel addition between a pixel <i, j> and a pixel <i, j+2> is achieved such that a column addition switch 72a is turned into the ON state, and in this state, selection circuits 63 of the respective pixels <i, j> and <i, j+2> are simultaneously turned on. As a result, pixel values of these pixels are added together via vertical signal lines 47a and 47c, a connection line 71a, and the column addition switch 72a. Similarly, a pixel addition between a pixel <i, j+1> and a pixel <i, j+3> is achieved such that a column addition switch 72b is turned into the ON state, and in this state, selection circuits 63 of the respective pixels <i, j+1> and <i, j+3> are simultaneously turned on. As a result, pixel values of these pixels are added together via vertical signal lines 47b and 47d, a connection line 71b, and the column addition switch 72b.

Figure 24:
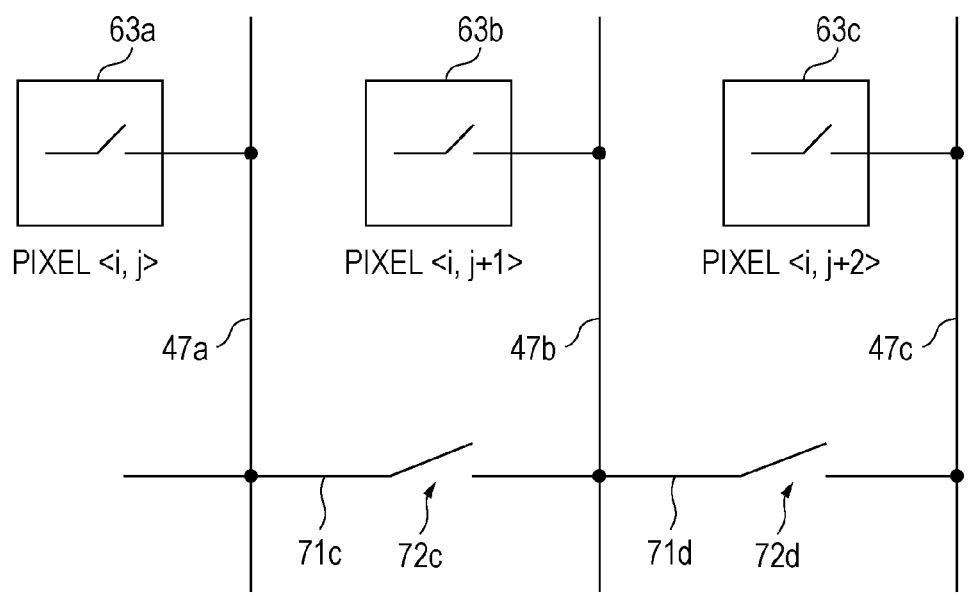
FIG. 24 illustrates an example of a pixel addition process performed among three columns.

FIG. 24 illustrates an example of a pixel addition process performed among three columns. A pixel addition between two adjacent pixels may be performed for two or more pixels. For example, a pixel addition may be performed for pixels in three columns using column switches connected as shown in FIG. 24. That is, a pixel addition for a pixel <i, j>, a pixel <i, j+1>, and a pixel <i, j+2> is achieved such that a column addition switches 72c and 72d are turned into the ON state, and in this state, selection circuits 63 of the respective pixels <i, j>, <i, j+1>, and <i, j+2> are simultaneously turned on. As a result, pixel values of these pixels are added together via vertical signal lines 47a, 47b, and 47c, connection lines 71c and 71d, and the column addition switches 72c and 72d. Note that a pixel addition for pixels connected to respective vertical signal lines <j>, <j+1>, and <j+2> shown in FIG. 5 may be achieved using the column switches connected in the manner shown in FIG. 24.

The addition operation does not necessarily need to be performed in the analog domain, but the addition operation may be performed in a digital domain as is in a case where the addition operation is performed, for example, in a counter digital memory in an ADC process in the column signal processing circuit 37.

Sixth Variation

Figure 25:
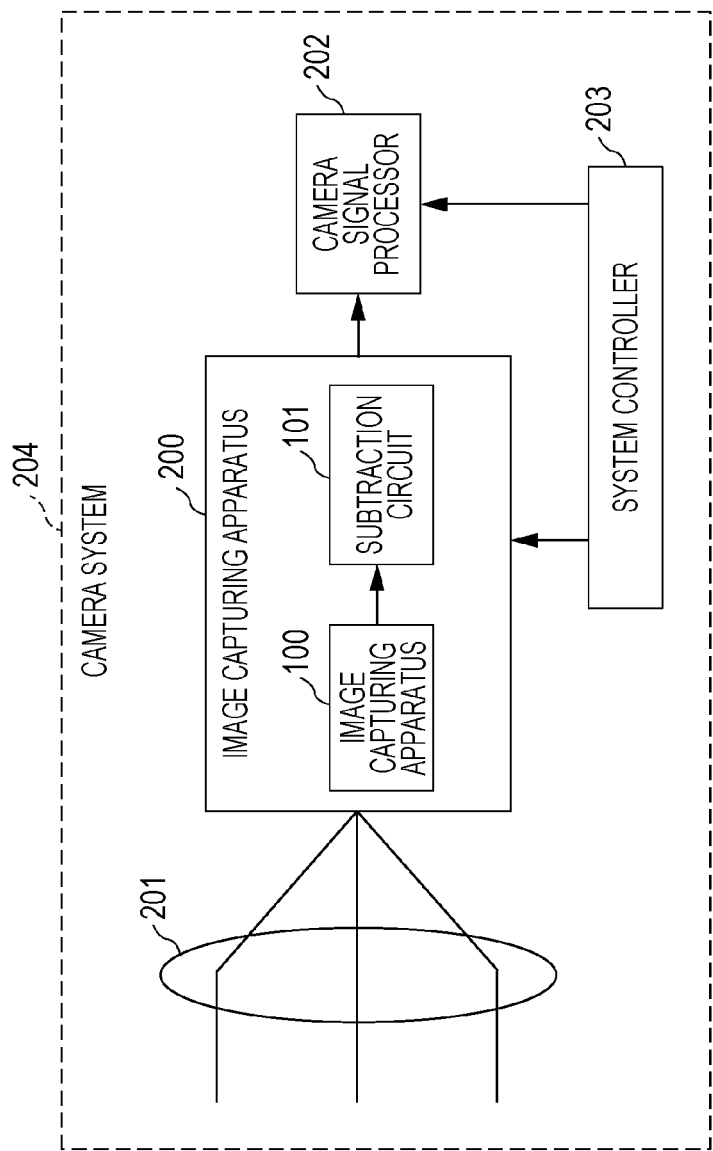
FIG. 25 illustrates a camera sensor system.

Referring to FIG. 25, a camera system 204 according to an embodiment is described below. FIG. 25 illustrates a system configuration of the camera system 204 according to the present embodiment. The camera system 204 includes a lens optical system 201, an imaging device 200, a system controller 203, and a camera signal processor 202. The lens optical system 201 includes, for example, an auto focus lens, a zoom lens, and a diaphragm. The lens optical system 201 focuses light on an imaging plane of the imaging device 200. As for the imaging device 200, the imaging device 100 according to the embodiment described above and a wide variety of modifications thereof may be employed. In the present embodiment, the imaging device 200 is a one-chip image sensor including, in addition to the imaging device 100 according to the embodiment described above, a subtraction circuit 101 that performs subtraction between signals output from the imaging device 100. The subtraction circuit 101 includes a memory that temporarily stores a signal output from the imaging device 100, and a subtractor that performs subtraction between signals stored in the memory. For example, referring to FIG. 1, the subtraction circuit 101 subtracts the sum of signals of the second pixel group from the sum of signals of the first pixel group and outputs a result as a signal of the pixel block 60. Thus it is possible to achieve a filtering process with both positive and negative operation coefficients in cooperation between the imaging device 100 and the subtraction circuit 101.

The system controller 203 controls the whole camera system 204. The system controller 203 may be realized, for example, by a microcomputer. The camera signal processor 202 functions as a signal processing circuit that processes an image signal output from the imaging device 200 and outputs resultant image data. The camera signal processor 202 performs processes including, for example, a gamma correction, a color interpolation process, a spatial interpolation process, an automatic while balance process, etc. The camera signal processor 202 may be realized, for example, by a digital signal processor (DSP).

In the camera system according to the present embodiment, use of the imaging device 100 according to the embodiment described above allows it to properly suppress reset noise (kTC noise) in a reading process. Thus, it is possible to accurately read the charge, which makes it possible to acquire a high-quality image.

The imaging device and the camera system according to the present disclosure have been described above with reference to embodiments and modifications. However, the present disclosure is not limited to the embodiments and the modifications described above. It will be apparent to those skilled in the art that many various changes may be applicable to the embodiments and the modifications without departing from the spirit and scope of the present disclosure. Furthermore, constituent elements of different embodiments or modifications may be combined. In this case, any resultant combination also falls within the scope of the present disclosure.

For example, in the embodiments described above, each unit pixel includes one pixel electrode provided under an optical window such as a microlens or color filter. Alternatively, each unit pixel may be defined by one pixel electrode. More specifically, a plurality of pixel electrodes may be provided under one microlens or color filter, that is, a plurality of pixel electrodes may be provided under one optical window, and a convolution filter may be applied to the plurality of pixels under one optical window.

The imaging device according to the present disclosure provides a feature that it is possible to reduce a digital processing load in image process, and is applicable to various camera systems and sensor systems such as a digital still camera, a medical camera, a monitoring camera, an in-vehicle camera, a digital single-lens reflex camera, a digital mirrorless interchangeable-lens camera, a mobile camera, a machine vision camera, a robot vision camera, etc.

What is claimed is:

1. An imaging device comprising:
a pixel array including a plurality of pixels including a first pixel and a second pixel, each pixel including a photoelectric converter that converts light into charge and a detection circuit that detects the charge, the photoelectric converter including a first electrode, a second electrode facing the first electrode, and a photoelectric conversion layer between the first electrode and the second electrode;
a first voltage supply circuit that supplies a first voltage to the first pixel such that an electric potential of the first electrode is set to a first electric potential at a point of time at which a charge accumulation period for the first pixel starts;
a second voltage supply circuit that supplies a second voltage to the second pixel such that an electric potential of the first electrode of the second pixel is set to a second electric potential different from the first electric potential at a point of time at which a charge accumulation period for the second pixel starts; and
an addition circuit that adds together a signal generated in the first pixel and a signal generated in the second pixel.

2. The imaging device according to claim 1, wherein
the addition circuit includes a vertical signal line that is connected to both the first pixel and the second pixel, and
the addition circuit adds together a signal output from the first pixel and a signal output from the second pixel.

3. The imaging device according to claim 1, wherein
each of the plurality of pixels includes a charge accumulation element that accumulates the charge generated in the photoelectric converter, and
the addition circuit includes an interconnection line that connects the charge accumulation element of the first pixel to the charge accumulation element of the second pixel.

4. The imaging device according to claim 1, wherein the addition circuit includes
a first vertical signal line that is connected to the first pixel and that transmits a signal output from the first pixel,
a second vertical signal line that is connected to the second pixel and that transmits a signal output from the second pixel, and
an interconnection line that connects the first vertical signal line to the second vertical signal line.

5. The imaging device according to claim 1, wherein an electric potential difference between the first electrode and the second electrode of the first pixel at the point of time at which the charge accumulation period for the first pixel starts is different from an electric potential difference between the first electrode and the second electrode of the second pixel at the point of time at which the charge accumulation period for the second pixel starts.

6. The imaging device according to claim 1, wherein
the pixel array includes a first pixel block that includes a first pixel group including the first pixel and a second pixel group including the second pixel, pixels belonging to the first pixel group being different from pixels belonging to the second pixel group, and
the addition circuit adds together signals respectively output from the pixels belonging to the first pixel group and adds together signals respectively output from the pixels belonging to the second pixel group.

7. The imaging device according to claim 6, further comprising a subtraction circuit that subtracts the sum of the signals respectively output from the pixels belonging to the second pixel group from the sum of the signals respectively output from the pixels belonging to the first pixel group.

8. The imaging device according to claim 6, wherein
the pixels belonging to the first pixel group are arranged in a first pattern and the pixels belonging to the second pixel group are arranged in a second pattern,
the pixel array includes a second pixel block different from the first pixel block, the second pixel block including a third pixel group including pixels arranged in the first pattern and a fourth pixel group including pixels arranged in the second pattern, and
the addition circuit adds together signals respectively output from the pixels belonging to the third pixel group and adds together signals respectively output from the pixels belonging to the fourth pixel group.

9. A camera system comprising:
the imaging device according to claim 1; and
a camera signal processor that processes an image signal output from the imaging device and outputs resultant image data.

10. The imaging device according to claim 1, wherein
the detection circuit includes a transistor having a source and a drain, one of the source and the drain being connected to the first electrode,
the first voltage supply circuit supplies the first voltage to the other one of the source and the drain of the transistor of the first pixel in a reset period for the first pixel, and
the second voltage supply circuit supplies the second voltage different from the first voltage to the other one of the source and the drain of the transistor of the second pixel in a reset period for the second pixel.

11. The imaging device according to claim 1, wherein
the detection circuit includes a capacitor, one end of the capacitor being connected to the first electrode,
the first voltage supply circuit supplies a first voltage to the other end of the capacitor in the charge accumulation period for the first pixel, and
the second voltage supply circuit supplies a second voltage different from the first voltage to the other end of the capacitor in the charge accumulation period for the second pixel.

12. The imaging device according to claim 1, wherein the second electrode of the first pixel and the second electrode of the second pixel form a single continuous electrode.

* * * * *